(12) United States Patent
Matsuyama

(10) Patent No.: US 9,153,467 B2
(45) Date of Patent: Oct. 6, 2015

(54) SUBSTRATE PROCESSING APPARATUS, SUBSTRATE PROCESSING METHOD AND NON-TRANSITORY COMPUTER-READABLE STORAGE MEDIUM

(71) Applicant: TOKYO ELECTRON LIMITED, Tokyo (JP)

(72) Inventor: Kenichirou Matsuyama, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 261 days.

(21) Appl. No.: 13/748,295

(22) Filed: Jan. 23, 2013

(65) Prior Publication Data

US 2013/0202386 A1     Aug. 8, 2013

(30) Foreign Application Priority Data

Feb. 8, 2012   (JP) .................................. 2012-25138

(51) Int. Cl.
*H01L 21/677* (2006.01)
*H01L 21/67* (2006.01)
*H01L 21/027* (2006.01)

(52) U.S. Cl.
CPC ........ *H01L 21/67712* (2013.01); *H01L 21/027* (2013.01); *H01L 21/67178* (2013.01); *H01L 21/67184* (2013.01); *H01L 21/67745* (2013.01)

(58) Field of Classification Search
CPC ................... H01L 21/67712; H01L 21/67745; H01L 21/67178; H01L 21/67184
USPC .......................................... 414/805, 935–941
See application file for complete search history.

(56) References Cited

U.S. PATENT DOCUMENTS

2008/0025823 A1*   1/2008   Harumoto .................. 414/217.1

FOREIGN PATENT DOCUMENTS

JP          2011-176122 A     9/2011

\* cited by examiner

*Primary Examiner* — Saul Rodriguez
*Assistant Examiner* — Ashley Romano
(74) *Attorney, Agent, or Firm* — Nath, Goldberg & Meyer; Jerald L. Meyer

(57) ABSTRACT

A substrate processing apparatus includes a control unit performing loading substrates into a second unit block when a trouble occurs in a module of a first unit block; determining whether it is before a leading substrate of a next lot of the lot where a standby substrate positioned in upper stream side than the troubled module belongs is loaded into the module in the uppermost stage of the second unit block; loading the standby substrate into the module in the uppermost stage of the second unit block when determined it is before the loading of the leading substrate and loading the standby substrate into the module in the uppermost stage of the second unit block after a rearmost substrate of the next lot is loaded into the module in the uppermost stage of the second unit block when determined otherwise; and performing a series of processing on the standby substrate.

14 Claims, 18 Drawing Sheets

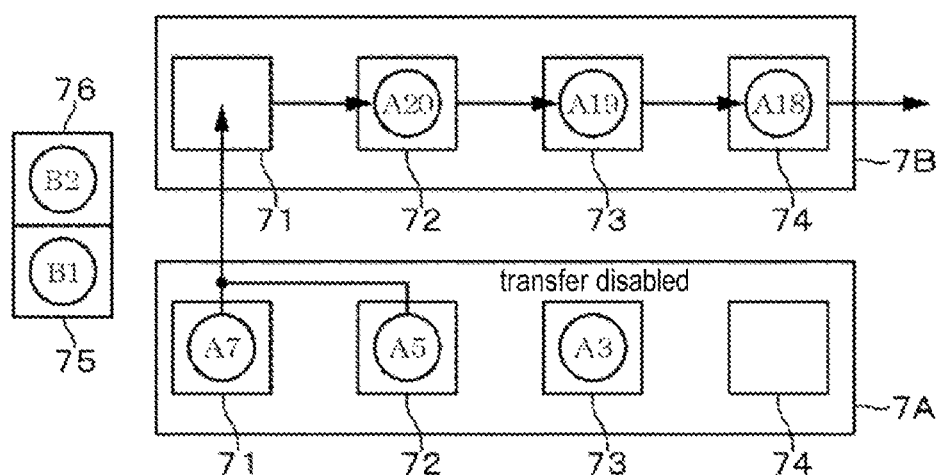
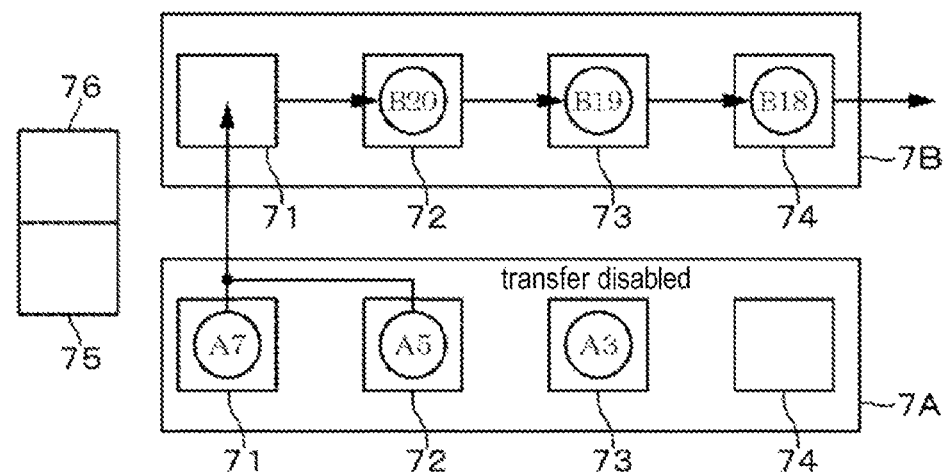

SUBSTRATE PROCESSING APPARATUS, SUBSTRATE PROCESSING METHOD AND NON-TRANSITORY COMPUTER-READABLE STORAGE MEDIUM

CROSS-REFERENCE TO RELATED APPLICATION

This application claims the benefit of Japanese Patent Application No. 2012-25138, filed on Feb. 8, 2012, in the Japan Patent Office, the disclosure of which is incorporated herein in its entirety by reference.

TECHNICAL FIELD

The present disclosure relates to a substrate processing apparatus, a substrate processing method and a non-transitory computer-readable storage medium for processing a substrate such as a semiconductor wafer or a LCD substrate (a glass substrate for liquid crystal display).

BACKGROUND

A photoresist process is one of semiconductor manufacturing processes. In a photoresist process, a resist pattern is formed by coating a surface of a semiconductor wafer (hereinafter, referred to as a wafer) with a resist, exposing the resist in a predetermined pattern, and then developing it to form a resist pattern. A coating and developing apparatus to form the resist pattern includes processing blocks which include processing modules for performing various processes on the wafer.

In the related art, the processing block, for example, is formed by stacking together a unit block to form various coating films such as a resist film and a unit block to perform the developing process. A plurality of fluid treatment modules to perform a coating processing of resist fluid or developing fluid or a plurality of heating modules to perform a heating processing are incorporated in the unit block.

In such coating and developing apparatus, a plurality of unit blocks to perform the same processing on wafers are installed from the viewpoint of improving the throughput. In the related art, when a plurality of unit blocks to perform the same processing are stacked, wafers are discharged to each of unit blocks in sequence, processed in each of the unit blocks, and then unloaded from each of the unit blocks according to the sequence that they are being discharged to each of the unit blocks.

When a module that performs a predetermined processing on the wafer is disabled and there is no other module that performs the same processing in one unit block, it is not possible to continue processing wafers in the upper stream side of the disabled module in the unit block. The wafers in the upper stream is recovered from the coating and developing apparatus and subjected to, for example, a predetermined process (rework process) so as to be in a state of being subjected to coating and developing again, and then loaded into the coating and developing apparatus. However, it is difficult to perform such series of processing and there is a need to reduce the number of wafers (rework wafers) on which the rework process is performed. In addition, a preparing operation is required to change processing conditions of many wafers in response to switching of the lot in some modules. There is a need to reduce the number of times of the preparing operation, thereby reducing the number of the rework wafer while preventing the processing from stagnating.

In the related art, it has been described how to manage a situation where a multi-module performing the same processing on the substrate is disabled. However, it is not sufficient to solve the above-mentioned problem.

SUMMARY

The present disclosure is intended to reduce the number of substrates recovered without being processed while suppressing a decrease in throughput when trouble occurs in the module.

According to one embodiment of the present disclosure, a substrate processing apparatus is provided in which every lot of substrates is loaded into a processing block, the processing block includes a plurality of unit blocks configured to perform a series of the same processing, each of the unit blocks includes a group of modules configured to perform a series of processing on substrates and a first transfer mechanism configured to sequentially transfer the substrates from modules in upper stream side to modules in lower stream side which constituting the group of modules, the substrates loaded into the processing block are sequentially distributed to the modules in the uppermost stage of each of the plurality of unit blocks by a second transfer mechanism and subjected to a series of processing at the unit block where the substrates are distributed, and a control unit is provided to control the apparatus, the control unit outputs a control signal so as to perform stopping the loading of the substrates into a first unit block and operating the second transfer mechanism so as to load the substrates into a second unit block when a trouble occurs in the module of the first unit block, determining whether or not it is before a leading substrate of a next lot of the lot where a standby substrate positioned on the module in upper stream side than the troubled module of the first unit block belongs is loaded into the module in the uppermost stage of the second unit block, according to the determination, controlling the first and second transfer mechanisms so as to load the standby substrate into the module in the uppermost stage of the second unit block when determined that it is before the loading of the leading substrate and to load the standby substrate into the module in the uppermost stage of the second unit block after a rearmost substrate of the next lot is loaded into the module in the uppermost stage of the second unit block when determined that it is after the loading of the leading substrate, and controlling the first transfer mechanism of the second unit block so as to perform the series of processing on the standby substrate loaded into the module in the uppermost stage of the second unit block.

According to another embodiment of the present disclosure, a substrate processing method using the substrate processing apparatus of the present disclosure is provided. The substrate processing method includes stopping the loading of the substrates into a first unit block and operating the second transfer mechanism so as to load the substrates into a second unit block when a trouble occurs in the module of the first unit block, determining whether or not it is before a leading substrate of a next lot of the lot where a standby substrate positioned on the module in upper stream side than the troubled module of the first unit block belongs is loaded into the module in the uppermost stage of the second unit block, according to the determination, controlling the first and second transfer mechanisms so as to load the standby substrate into the module in the uppermost stage of the second unit block when determined that it is before the loading of the leading substrate and to load the standby substrate into the module in the uppermost stage of the second unit block after a rearmost substrate of the next lot is loaded into the module in the uppermost stage of the second unit block when determined that it is after the loading of the leading substrate, and controlling the first transfer mechanism of the second unit block so as to perform the series of processing on the standby substrate loaded into the module in the uppermost stage of the second unit block.

According to another embodiment of the present disclosure, a non-transitory computer-readable storage medium having thereon a computer program which performs, when used by the substrate processing apparatus, the substrate processing method of the present disclosure.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is a schematic diagram showing the wafer transfer path in an abnormal case by means of the coating and developing apparatus.

FIG. 7 is a schematic diagram showing the wafer transfer path in an abnormal case by means of the coating and developing apparatus.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
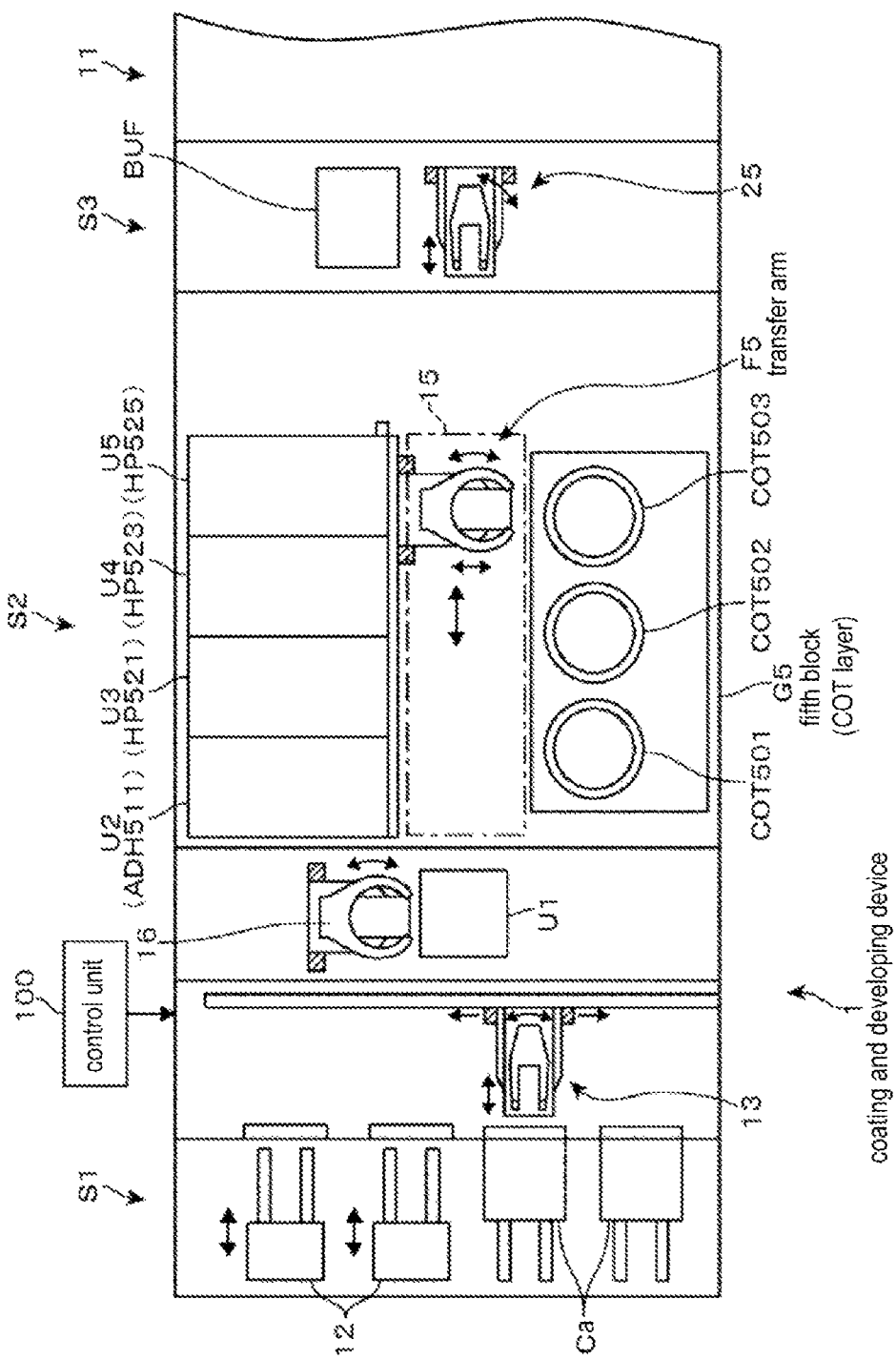
FIG. 1 is a plan view of a resist-pattern forming system including a coating and developing apparatus in accordance with the present disclosure.
Figure 2:
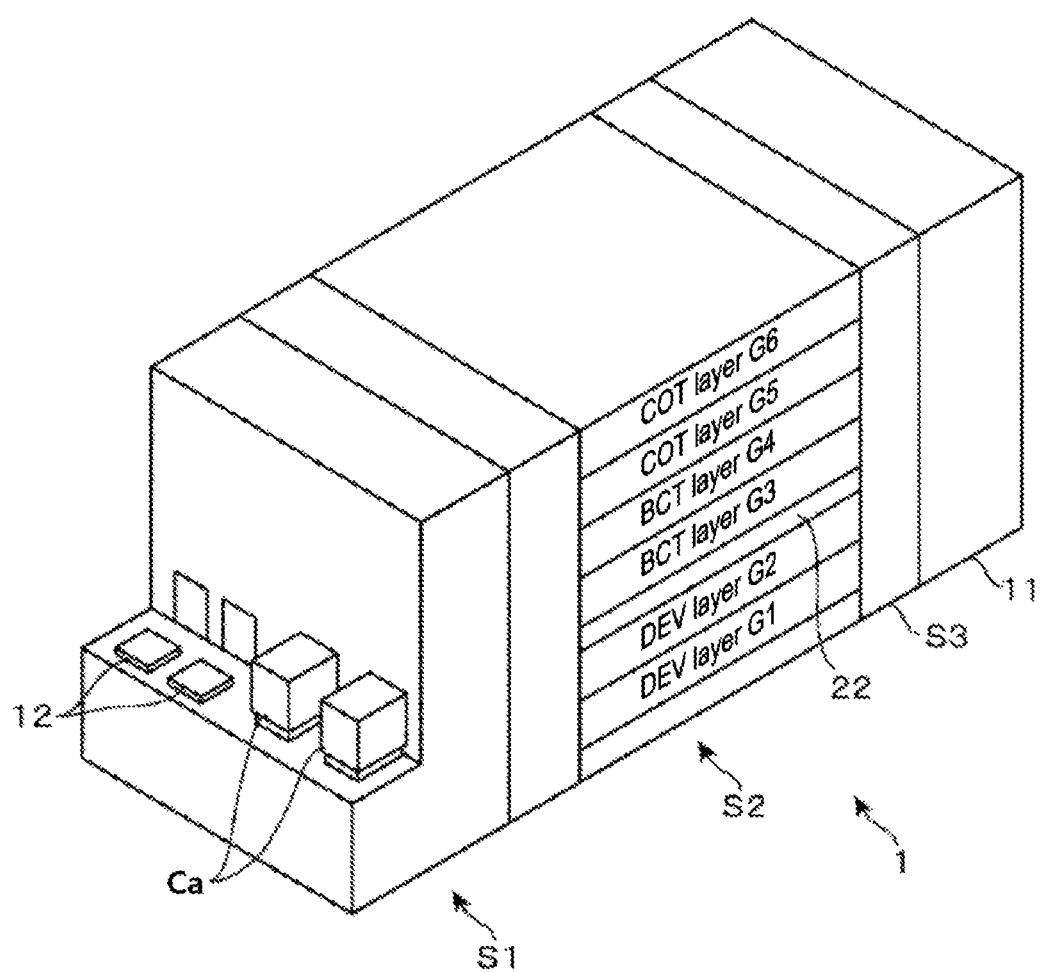
FIG. 2 is a perspective view of the resist-pattern forming system.
Figure 3:
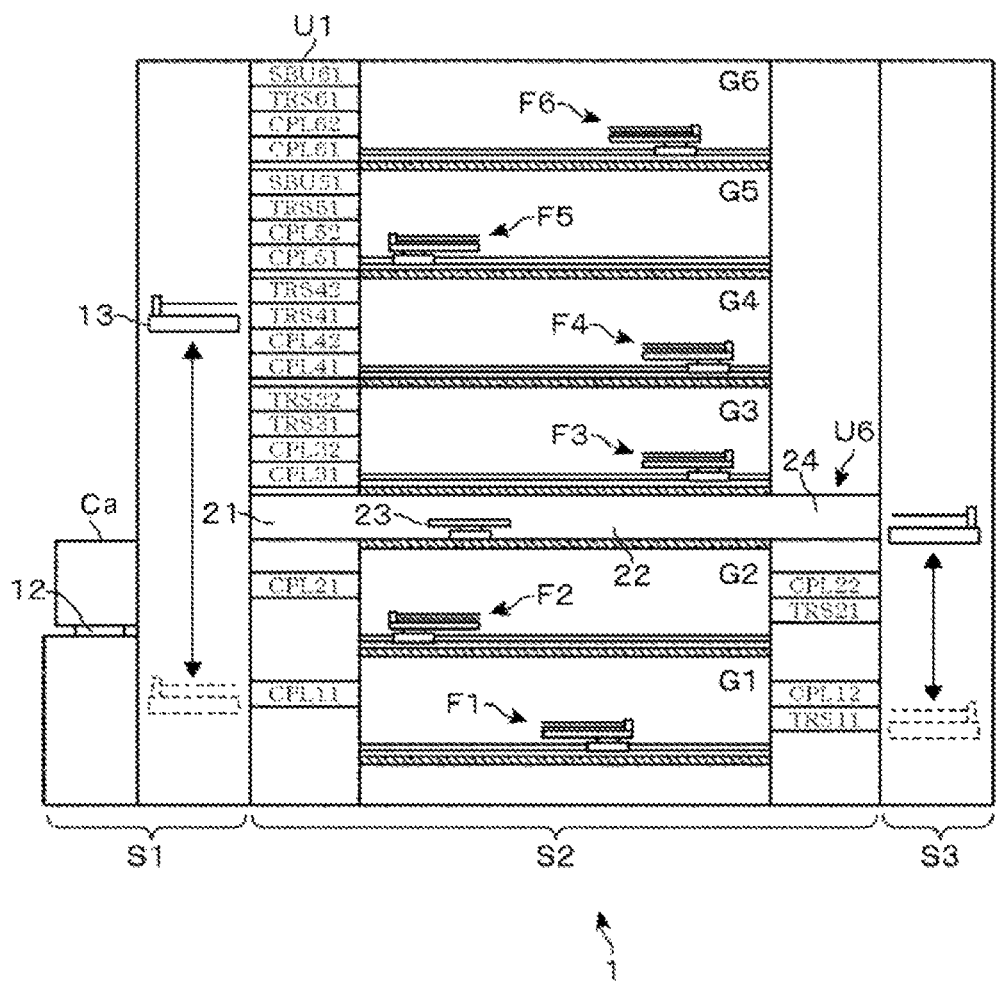
FIG. 3 is a side view of a longitudinal cross-section of the coating and developing apparatus.

A coating and developing apparatus 1, which is one embodiment of the substrate processing apparatus of the present disclosure, will be described with reference to FIGS. 1 to 3. An exposure device 11 is connected to the coating and developing apparatus 1, thus forming a resist-pattern forming system. FIG. 1 is a plane view and FIG. 2 is a perspective view of the system. FIG. 3 is a schematic side view of the coating and developing apparatus 1. The system is formed by linearly connecting a carrier block S1, a processing block S2, an interface block S3, and the exposure device 11 in this order.

The carrier block S1 is a block where carriers Ca where a plurality of wafers W are stored are loaded from outside, and the reference numeral 12 in the drawings refers to a mounting table of the carrier Ca. The reference numeral 13 refers to a first delivery arm configured to deliver wafers W between the carrier Ca and a shelf unit U1 described below.

The processing block S2 is formed by stacking a first unit block (DEV layer) G1, a second unit block (DEV layer) G2, a shuttle movable block 22, a third unit block (BCT layer) G3, a fourth unit block (BCT layer) G4, a fifth unit block (COT layer) G5, and a sixth unit block (COT layer) G6 in this order from the lower side. A shuttle 23 which is a direct transfer mechanism is provided in the shuttle movable block 22. The shuttle 23 moves from a delivery portion 21 of the shelf unit U1 described below to a delivery portion 24 of a shelf unit U6 described below to transfer wafers W directly.

Because of each unit block G is similar to each other in its layout and configuration, the fifth unit block G5 shown in FIG. 1 will be described representatively. A transfer path 15 of the wafer W is formed in the unit block G5 from the carrier block S1 side toward the interface block S3 side. A transfer arm F5 configured to transfer the wafer W is provided in the transfer path 15 so that it can deliver wafers W between modules of the unit block G5. The transfer arm F5 can access each module provided at the level of the unit block G5 in the shelf unit U1 and perform a loading/unloading of wafers W. In addition, the transfer arm F5 includes two holding portions, each of which holds the wafer W independently. One of holding portions receives the wafer W from the module and the other delivers the wafer W to the module. In other words, the holding portions operate to exchange the wafer W with the module. A module refers to a place where the wafer W is placed, and a processing module refers to a module which processes the wafer W.

Three resist coating modules COT501 to COT503 which are liquid treatment modules are provided along the right side of the transfer path 15, when viewed from the carrier block S1 side. The resist coating modules COT501 to CTO503 are modules for forming the resist film, and each of which includes a cup that surrounds the circumference of the wafer W. In addition, the resist coating modules COT501 to COT503 include a nozzle for supplying a resist liquid on surfaces of wafers W, and the nozzle is shared by the resist coating modules COT501 to COT503. Further, the resist coating modules COT501 to COT503 can perform the same processing of forming the resist film on the wafer W, and wafers W are transferred in the same order, respectively, to the coating and developing apparatus 1. Such a module is called a multi-module. For example, hydrophobization treatment modules ADH511 to ADH512 and heating modules HP521 to HP526 described below are also multi-modules.

Shelf units U2 to U5 are provided along the left side of the transfer path 15, when viewed from the carrier block S1. Each of the shelf units U2 to U5 is formed by stacking modules in two stages. The shelf unit U2 includes hydrophobization treatment modules ADH511 and ADH512 which supply treatment gas to the surface of the wafer W before forming the resist film to hydrophobize the surface of the wafer W. The shelf modules U3 to U5 include heating modules HP521 to HP526 which heat the wafer W after coating the resist. The heating modules HP521 to HP526 include hot plates whose temperature is changeable and heat the wafer W placed on the hot plate to a desired temperature.

Unit blocks other than the unit block G5 will be described. The unit block G6 has the same configuration as that of the unit block G5. In order to distinguish from each part of the unit block G5, resist coating modules are referred to as COT601 to COT603, hydrophobization treatment modules as ADH611 and ADH 612, heating modules as HP621 to HP626, and the transfer arm as F6 in the unit block G6. Unit blocks G3 and G4 are configured in the same way as unit blocks G5 and G6 except that anti-reflection film forming modules BCT are provided in place of the resist coating modules COT as fluid treatment modules. In FIG. 3, F3 and F4 indicate transfer arms of the unit blocks G3, G4, respectively.

For unit blocks G1 and G2, developing modules DEV which supply developing fluid to wafers W in place of resist coating modules COT as fluid treatment modules are provided. In addition, heating modules PEB for heating wafers W after exposure but before development are provided in the shelf units U4 and U5, and heating modules POST for heating wafers W after development are provided in the shelf units U2 and U3 (see FIG. 21).

The shelf unit U1 is provided at the carrier block S1 side in the processing block S2 so as to bridge the unit blocks G1 to G6. The shelf unit U1 is formed by stacking a number of modules including buffer modules SBU where a plurality of wafers W can be loaded, delivery modules TRS where the wafer W is loaded, and CPL. The delivery module CPL includes a loading table where the wafer W is loaded and a flow passage configured to supply temperature-adjusted cooling water to the loading table, thereby adjusting the temperature of the loaded wafer W. The shelf unit U1 further includes a delivery portion 21 into which the shuttle 23 is entered so as to deliver wafers W to the shuttle 23.

The shelf unit U1 will be further explained. As shown in FIG. 3, delivery modules CPL11 and CPL21 are provided at levels of the unit blocks G1 and G2, respectively. Delivery modules CPL31, CPL32, TRS31, and TRS32 are provided at the level of the unit block G3, and delivery modules CPL41, CPL42, TRS41 and TRS42 at the level of the unit block G4. Delivery modules CPL51, CPL52, TRS51 and a buffer module SBU51 are provided at the level of the unit block G5, and delivery modules CPL61, CPL62, TRS61 and a buffer module SBU61 at the level of the unit block 6.

In the vicinity of the shelf unit U1, a second delivery arm 16 is provided which is vertically movable to deliver the wafer W between modules and between the module and the shuttle (see FIG. 1). Each delivery module provided at the level corresponding to each unit block along a hoistway of the second delivery arm 16, which is a second transfer mechanism, in the shelf unit U1 also serves as one module of the group of modules of the corresponding unit block.

Further, the shelf unit U6 is provided at the interface block S3 side in the processing block S2 so as to span the unit blocks G1 and G2 and the shuttle movable block 22. In the shelf unit U6, the delivery portion 24 and the delivery modules TRS and CPL are stacked together. The transfer arms F1 and F2 of the unit blocks G1 and G2 are configured to access the delivery modules TRS and CPL. The transfer arms F1 and F2 are configured in the same way as the transfer arm F5 of the unit block G5. As shown in FIG. 3, delivery modules CPL12 and TRS11 are provided at the level of the unit block G1, and delivery modules CPL22 and TRS21 are provided at the level of the unit block G2 in the shelf unit U6.

An interface arm 25 and a buffer module BUF which is a standby module where a plurality of wafers W is on standby before loaded into the exposure device 11 are provided in the interface block S3. The interface arm 25 is configured to transfer the wafer W among the exposure device 11, each module of the shelf unit U6, the shuttle 23 moved to the delivery portion 24 and the buffer module BUF. The exposure device 11 exposes the wafer W according to a predetermined pattern. Then, the exposed wafer W is developed in the development module DEV to form a resist pattern.

A control unit 100 including a computer is provided in the coating and developing apparatus 1. The control unit 100 includes data processing units including a program, a memory and a CPU. The program incorporates instructions (steps) to send control signals from the control unit 100 to each portion of the coating and developing apparatus 1 to control the operation of the transfer arm, the delivery arm and the interface arm to transfer the wafer W, and to perform each processing described below. Further, the control unit 100 sends a recipe corresponding to the lot of wafers W before the lot is loaded into each unit block. According to this recipe, a preparing operation described below is performed in a predetermined module, and the wafer W is processed under the processing conditions corresponding to the lot. The program (also including a program for input operation or display of processing parameters) is stored in a computer-readable storage medium such as a flexible disk, a compact disk, a hard disk, MO (magneto-optical disk), a memory card and installed in the control unit 100.

After the wafers W in one lot are transferred continuously from the carrier Ca, wafers W in another lot are transferred. That is, the wafers W in each lot are transferred to the processing block S2 in the coating and developing apparatus 1. Then, the wafers W discharged from the carrier Ca are transferred one by one among the modules in sequence described below, and processed. Usually, the wafers W transferred from the carrier Ca are set to be distributed alternatively and transferred to, for example, a path 1: BCT layer G3→COT layer G5→DEV layer G1 and a path 2: BCT layer G4→COT layer G6→DEV layer G2. In other words, wafers W in the same lot are distributed to each of the duplicated unit blocks. In addition, if the module in the transfer path described below is configured as a multi-module, the wafers W are transferred to one of the modules forming the multi-module.

After being transferred from the carrier Ca to the delivery module TRS31 by the first delivery arm 13, the wafers W of the path 1 are transferred by the transfer arm F3 of the unit block G3 in the order of: hydrophobization treatment module ADH→delivery modules CPL31 and CPL 32→anti-reflection film forming module BCT→heating module→delivery module TRS32. The wafers W on which the anti-reflection film is formed through this transfer are transferred from the delivery module TRS32 to the delivery module TRS51 by the second delivery arm 16. Then, the wafers W are transferred in the order of: hydrophobization treatment modules ADH511 and ADH512→delivery modules CPL51 and CPL52→resist coating modules COT501 to COT503→heating modules HP521 to HP526→buffer module SBU51 by the transfer arm F5 in the unit block G5.

The wafers W on which the resist film is formed through the above transfer are transferred from the buffer module SBU51 to the shuttle 23 of the delivery portion 21 by the second delivery arm 16. The shuttle 23 is moved to the delivery portion 24. Then the wafers W are delivered by the interface arm 25. Once being transferred to and staying in the buffer module BUF, the wafers W are transferred to the exposure device 11 to be exposed. The wafers W are transferred to the delivery module TRS11 by the interface arm 25. Then, the wafers W are transferred in the order of: heating module PEB→delivery module CPL12→developing module DEV→heating module POST→delivery module CPL11, by the transfer arm F1 in the unit block G1, and are subjected to a developing process. Then, the wafers W are returned from the delivery module CPL11 to the carrier Ca by the first delivery arm 13.

The transfer of the wafers W on the path 2 performed in the same way as on the path 1 except that the transferred unit block is different. Briefly, after transferred from the carrier Ca to the delivery module TRS41 by the first delivery arm 13, the wafers W are transferred through modules of the unit block G4 in the same order as on the path 1, and transferred to the delivery module TRS42. Then, the wafers W are transferred from the delivery module TRS42 to the delivery module TRS61 by the second delivery arm 16, and transferred in the order of: hydrophobization treatment modules ADH611 to ADH612→delivery modules CPL61 to CPL62→resist coating modules COT601 to COT603→heating modules HP621 to HP626→buffer module SBU61 in the unit block G6.

Then, after transferred to the exposure device 11 through the second delivery arm 16, the shuttle 23, and the interface arm 25 in the same way as on the path 1, the wafers W are transferred to the delivery module TRS21 by the interface arm 25, transferred through each module of the unit block G2 in the same order as the path 1, and then returned from the delivery module CPL21 to the carrier Ca by the first delivery arm 13.

In the above-described transfer, a destination module is set in advance for each wafer W. Further, even when a trouble occurs in one of modules making up the multi-module and the transfer of the wafers W to the one of modules is disabled, the setting may be changed to transfer the wafer W to another module making up the multi-module if the transfer to the another module is possible. However, when the trouble occurs in all of the modules making up the multi-module in one unit block G such that the transfer is disabled or when the transfer to the module which is not configured as a multi-module is disabled, it will not be possible to transfer the wafers W to the lower stream side of the transfer path in the unit block G described above. In this case, a temporary transfer is performed.

Figure 4:
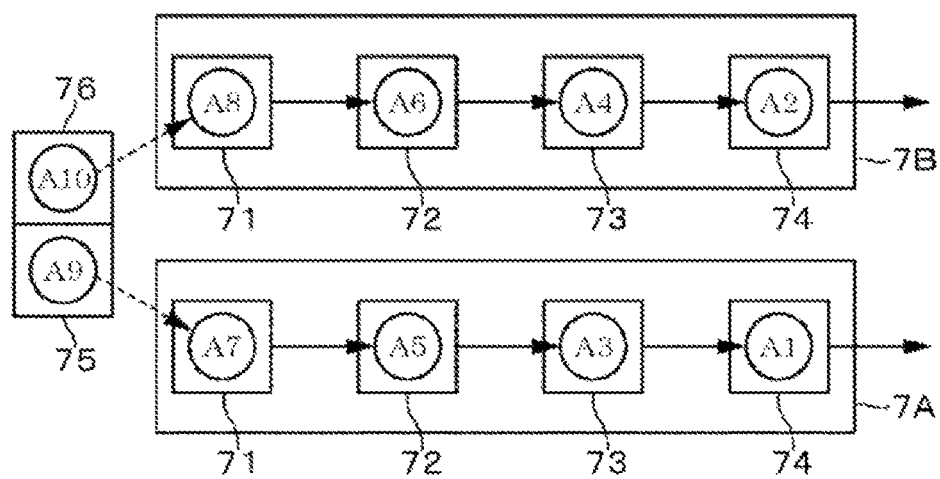
FIG. 4 is a schematic view showing a wafer transfer path in a normal case by means of the coating and developing apparatus.
Figure 5:
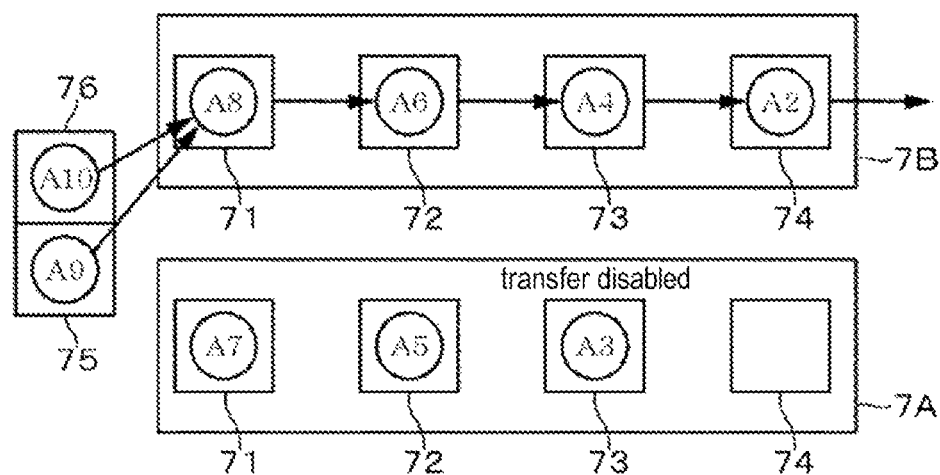
FIG. 5 is a schematic diagram showing the wafer transfer path in an abnormal case by means of the coating and developing apparatus.

FIGS. 4 to 7 are schematic diagrams for explaining how to switch from a normal transfer to a temporary transfer in a schematic way. FIG. 4 shows the normal transfer, and FIGS. 5 to 7 show the temporary transfer, respectively. In each drawing, the lots of wafers W are indicated as A and B, and numbered after A and B according to the order of being discharged from the carrier Ca. 7A and 7B indicate equally formed unit blocks, and 71 to 74 indicate modules in each drawing. The modules 71, 74 form loading/unloading ports of each unit block G, respectively. In the drawings, 75 and 76 are external modules of unit blocks 7A and 7B, and a transfer is performed from the modules 75 and 76 to unit blocks 7A and 7B. Normally, the wafers W are continuously discharged from the carrier Ca. Therefore, when the transfer is no longer performed in the unit block, the wafer W (standby substrate) is also transferred to the upper stream side of the module (troubled module) to which the transfer is disabled.

Here, the transfer to the module 73 of the unit block 7A is disabled, thus disabling the transfer in the unit block 7A, while the lot A is being transferred into the unit blocks 7A and 7B as shown in FIGS. 4 and 5. Therefore, the wafers W whose numbers are prior to A7 remain in the modules. When the transfer has been disabled, the control unit 100 determines whether or not the lot B which is the next lot of remaining wafers W is being loaded into the module 71 of the unit block 7A. In the example shown in FIG. 4, the wafer A8 of the lot A which is the same as that of the remaining wafers W is being transferred. Therefore, the result of the determination is negative.

Then, the transfer from the module 75 to the unit block 7A is stopped, and the wafer A9 subsequently transferred to the module 75 is also transferred to the unit block 7B with the wafer A10 transferred to the module 76, as shown in FIG. 5. The transfer of the wafers W from the modules 75 and 76 is continued, and the last wafer A20 of the lot A which is the same as that of the wafers W remaining in the unit block 7A is loaded into the unit block 7B. Then, as shown in FIG. 6, the wafers A5 and A7 in the upper stream side of the module 73 where the transfer is disabled in the unit block 7A are transferred to the module 71 of the unit block 7B, before the lot B is subsequently loaded into the unit block 7B. The wafers A5 and A7 are transferred to the lower stream side of the unit block 7B and processed as normal.

Operations when the control unit 100 determines the lot B, the next lot of the remaining wafers W is being loaded into the module 71 of the unit block 7A will be described. The lot B is transferred from the modules 75 and 76 only to the unit block 7B (not to the unit block 7A) in the same way as the case where the lot A is transferred. Then, after the last wafer (for example, wafer B20) of the lot B has been loaded into the unit block 7B, the wafers A5 and A7 are transferred to the module 71 of the unit block 7B as shown in FIG. 7. As seen from the wafers W of the modules 71 and 72, they are returned to the loading port of the unit block 7B from the unit block 7A into which they were already loaded, and transferred again through the unit block 7B. Such a transfer into another unit block is referred to as a return transfer.

Figure 8:
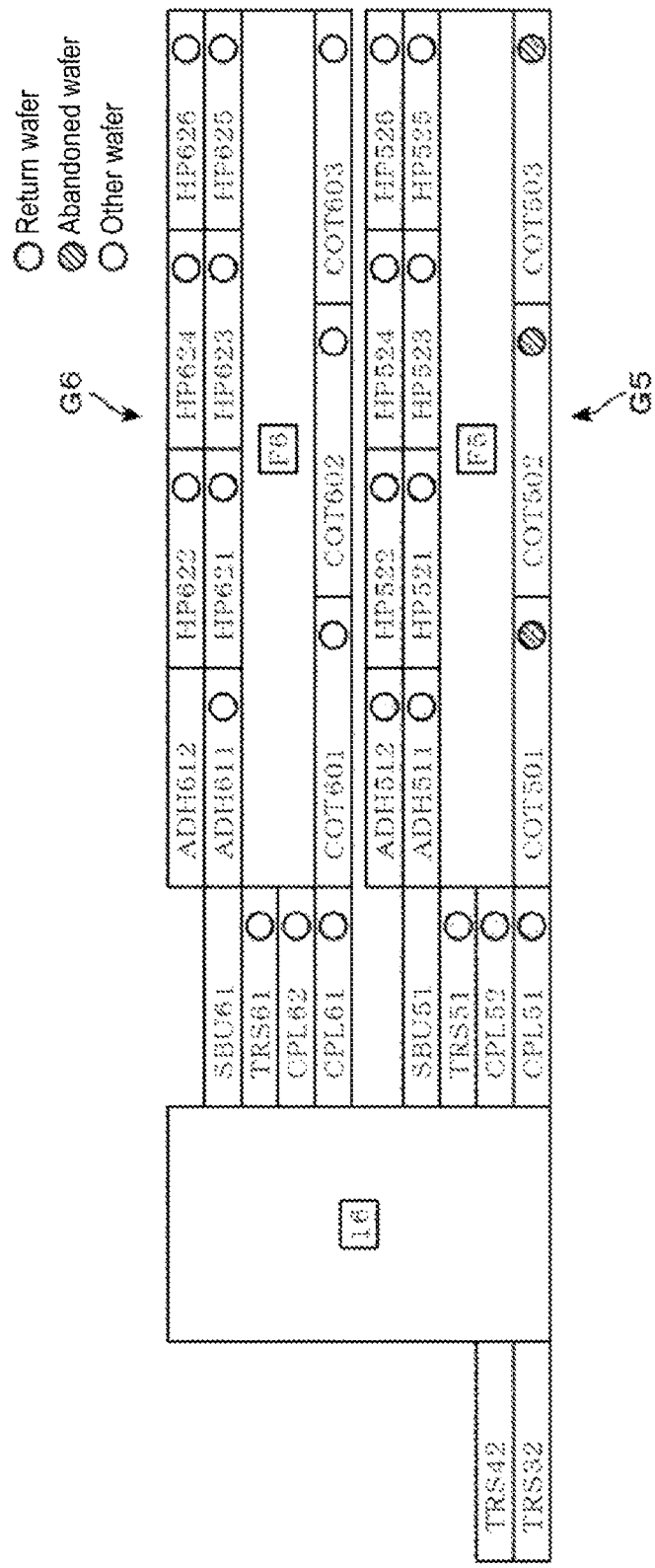
FIG. 8 is a schematic development view of unit blocks of the coating and developing apparatus.

Hereinafter, the return transfer will be described more specifically through an example where the transfer into the resist coating modules COT501 to COT503 is disabled and the wafers W can not be transferred to the lower stream side of the unit block G5 in the coating and developing apparatus 1. FIG. 8 shows a schematic configuration of the fifth unit block G5 and the sixth unit block G6 presented on a plane when the transfer is disabled. The module 74 briefly described above corresponds to buffer modules SBU51 and SBU61, the module 71 to delivery modules TRS51 and TRS61, and the module 73 to COT501 to COT503 and COT601 to COT603. The modules 75 and 76 correspond to delivery modules TRS32 and TRS42, respectively.

In the unit block G5, a return transfer can be performed for the wafers W in the upper stream side of the resist coating modules COT501 to COT503. In other words, the return transfer is performed for the wafers W loaded into the hydrophobization treatment modules ADH511 and ADH512, and delivery modules TRS51, CPL51 and CPL52. Besides, the return transfer can be also performed for the wafer W which the transfer arm F5 holds before loading into the resist coating modules COT501 to COT503. Hereinafter, the wafer W for which the return transfer can be performed is referred to as a return wafer, and indicated by the circle marked with a number of dots in each drawing below. The return wafers will be on standby in the modules into which they are loaded when the transfer to the lower stream side of the unit block G5 is disabled, until when the return transfer starts, as briefly described.

In FIG. 8, the wafers W (referred to as abandoned wafers) of the resist coating modules COT501 to COT503 are marked with diagonal lines. The wafers W marked with diagonal lines stay in the resist coating modules COT501 to COT503 or are transferred between layers and returned to the carrier Ca as normal, without being transferred to the subsequent modules. For each of the return wafers W, a user of the device can select whether or not the return transfer is to be performed. This is because there is a case where the wafer W becomes a rework wafer if the wafer stays for a long time in some modules.

The wafers W (shown as circles not marked with dots or diagonal lines in each drawing) transferred into each module of the unit groups G5 and G6 other than the return wafers W and the abandoned wafers W are normally transferred. For example, the wafers W located in the lower stream side of the resist coating modules COT 501 to COT 503 where the transfer is disabled, or the wafers W located in the heating modules HP521 to HP526 are normally transferred to the buffer module SBU51 and unloaded from the unit group G5.

When the transfer to the lower stream side of the unit block G5 is disabled, the second delivery arm 16 transfers the wafer W transferred to the delivery module TRS32 to the delivery module TRS61, instead of the delivery module TRS51, as described schematically. Thereafter, the wafer W is transferred in the unit block G6 as usual, and unloaded from the unit block G6 through the buffer module SBU61. In addition, the wafer W transferred to the delivery module TRS42 is normally transferred to the unit block G6 and processed. In other words, the transfer is performed so as to avoid the unit block G5.

Figure 9:
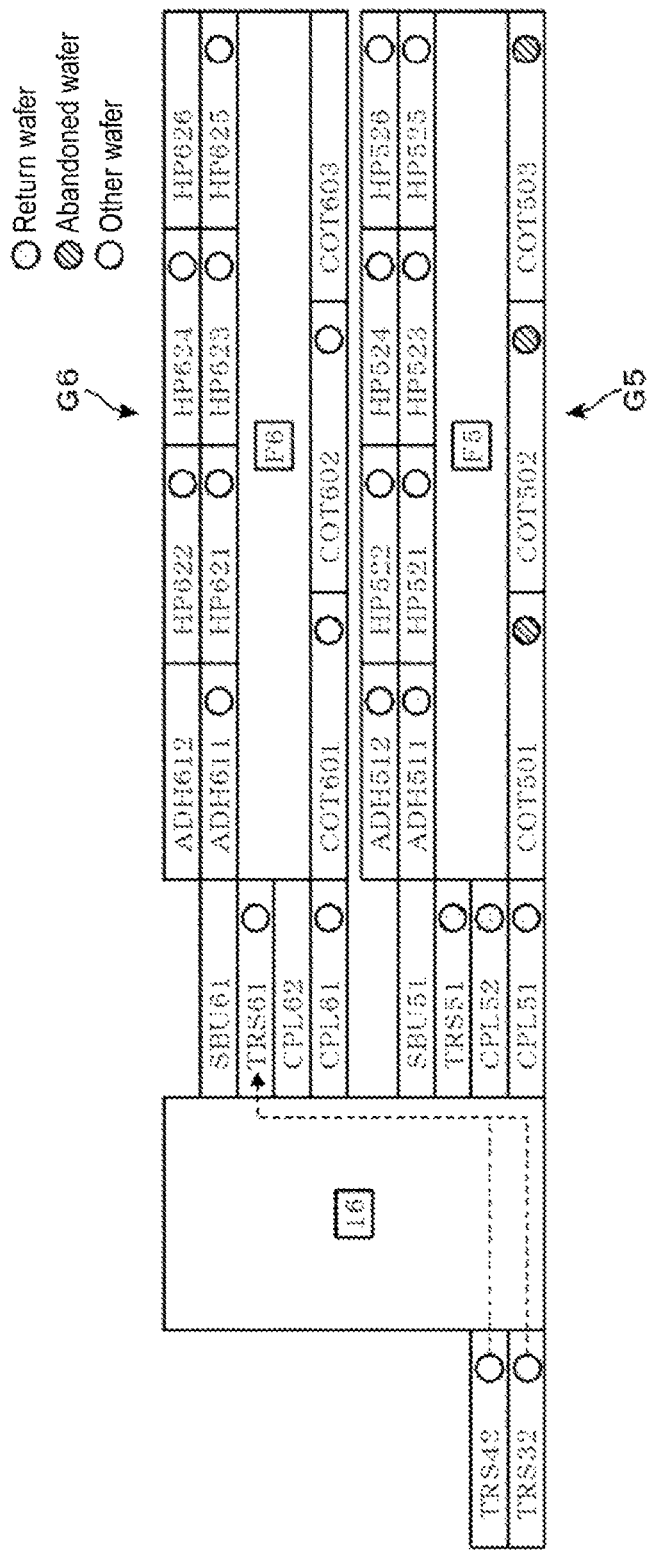
FIG. 9 is a schematic development view of unit blocks of the coating and developing apparatus.

When the transfer to the resist coating modules COT501 to COT503 is disabled, one module of a multi-module for each processing in the unit block G6 is set as a module (return transfer module) for processing the wafer W which is transferred through the return transfer. The wafer W transferred via the delivery modules TRS32 and TRS42 is transferred to the module other than the module set as a return transfer module. Thereby, a transfer path for the return wafer W is secured. FIG. 9 shows an example where the hydrophobization treatment module ADH612, the delivery module CPL62, the resist coating module COT603 and the heating module HP626 are set as return transfer modules. As described schematically, the loading of wafers W from the delivery modules TRS32 and TRS42 into the unit block G6 continues until a break of the lot being loaded into the unit block G6. For example, a module which quickly finishes the processing of the lot is set as the return transfer module, among the multi-module.

When the lot of the return wafer is different from the lot being loaded from the delivery modules TRS32 and TRS42 to the unit block G6, as described below, a preparing operation for processing the return wafer W is performed in the heating module HP626 and the resist coating module COT603 is set as the return transfer modules. The preparing operation of the resist coating module COT 603 includes a process of cleaning a cup and a discharging process for removing the old resist from a nozzle, so-called a dummy dispense. Further, the preparing operation of the heating module HP626 includes adjusting (setting) a temperature of a hot plate. The preparing operation is performed while another resist coating module COT and heating module are processing the normal wafers W.

Figure 10:
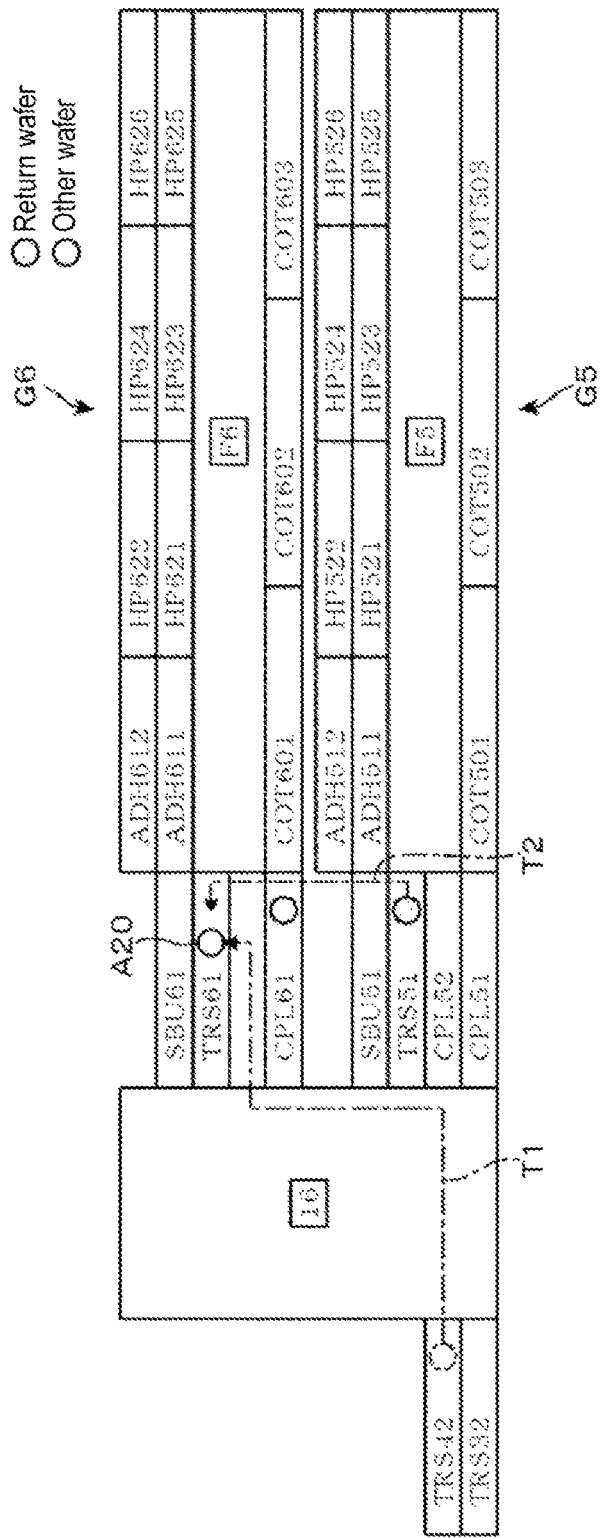
FIG. 10 is a schematic development view of unit blocks of the coating and developing apparatus.

As described schematically, the return transfer starts after the last wafer W of the lot to be loaded into the unit block is loaded into the unit block. As shown in FIG. 10, after the wafer A20, the last wafer W of the lot A, is transferred to the delivery module TRS 61 and taken in the unit block G6 (step T1 in FIG. 10), the return wafer W is transferred to the delivery module TRS61 via the buffer module SBU51 by the second delivery arm 16 (step T2 in FIG. 10).

The reason for controlling the return transfer in this manner will be described. There is a case where the lot of wafers W to be loaded into the unit block G6 is different from the lot of the return wafer W, depending on the timing when the loading into COT501 to COT503 is disabled. If the lot of the return wafer W is A and the lot of the wafer W being loaded is B, the preparing operation described above needs to be performed on the return transfer module of the unit block G6 so as to change the status of the return transfer module from processing the wafers W of the lot B to processing the wafers W of the lot A. For the lot B being loaded into the unit block G6, the loading is performed until the last wafer W is loaded. Thereafter, the wafer W of the lot A is returned and loaded into the unit block. At this time, it is not necessary to perform the preparing operation each time the wafer W is transferred, since it has already determined which of the lots A and B is loaded, from the perspective of the return transfer module of the unit block G6. If the return transfer ends, the wafers W of a subsequent lot (lot C) are loaded in a cluster, thus making it possible to process the wafers W of the lot C subsequently after the preparing operation for the lot C. Thereby, the number of times the preparing operation is performed can be suppressed.

The following describes the modules which the return wafers W will undergo. These modules will be used between when the return wafer W is transferred before processed by the delivery module CPL in the unit block where the transfer is disabled (case 1-1) from when the return wafer W is transferred after processed by the delivery module CPL (case 1-2).

In the case 1-1, after being transferred from the unit block where the transfer is disabled to the loading module of the unit block where the transfer is possible, the return wafer W is transferred to the module for the next step of the module where the last transfer is performed in the unit block where the transfer is disabled. In the case 1-2, after being transferred from the unit block where the transfer is disabled to the loading module of the unit block where the transfer is possible, the return wafer W is transferred to the delivery module CPL. After being temperature-adjusted in the delivery module CPL, the return wafer W is also transferred to the module for next step of the module where the last transfer is performed in the unit block where the transfer is disabled. In other words, the return wafer W must be transferred to the delivery module CPL and temperature-adjusted in either case.

Figure 11:
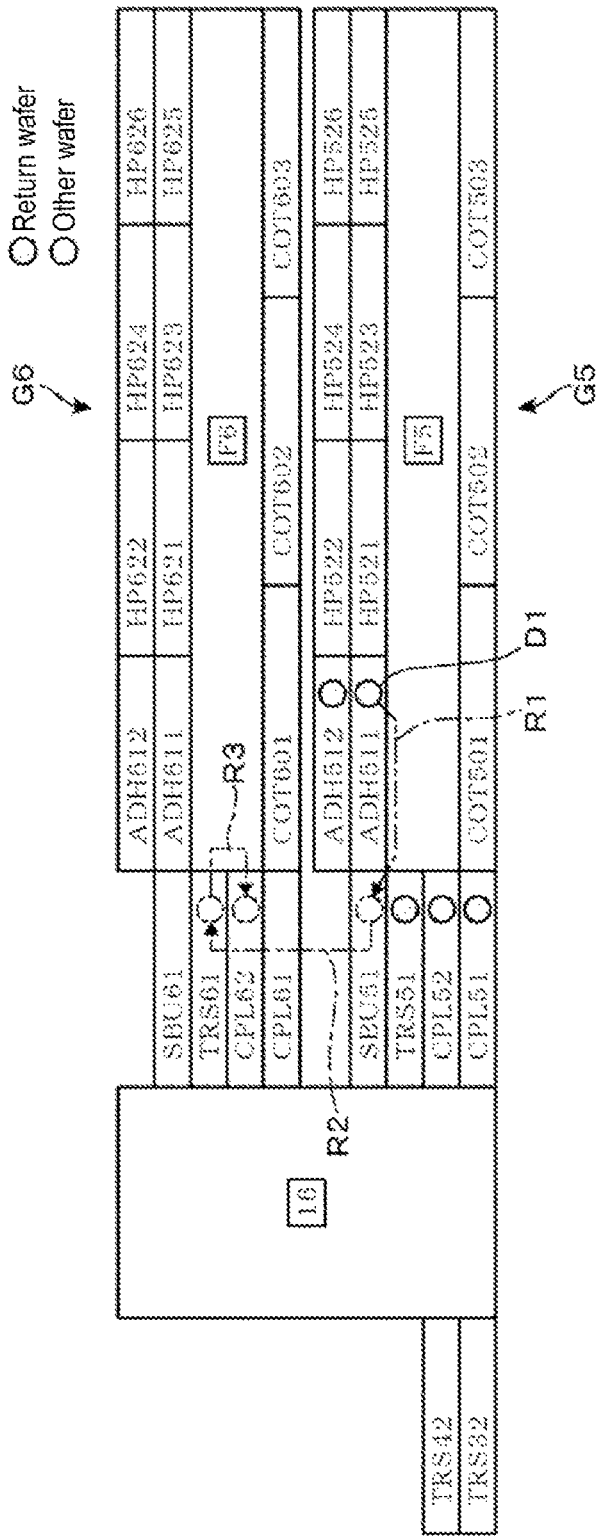
FIG. 11 is a schematic development view of unit blocks of the coating and developing apparatus.

A return transfer of the wafer (D1 in FIG. 11) loaded in the hydrophobization treatment module ADH511 will be described in detail with reference to FIG. 11. This corresponds to the case 1-1, since the hydrophobization treatment module ADH511 is located in the upper stream side than the delivery modules CPL51 and CPL52. First, the wafer D1 is transferred to the buffer module SBU51 by the transfer arm F5 (step R1). Thereafter, the wafer D1 is transferred to the delivery module TRS61 of the unit block G6 by the second delivery arm 16 (step R2). The wafer D1 has already been subjected to each processing up to the hydrophobization treatment by the module ADH. The next processing of the module ADH is a temperature adjustment by the delivery module CPL. Therefore, the transfer arm F6 transfers the wafer D1 from the delivery module TRS61 to the delivery module CPL62 which is set as the return transfer module of the two delivery modules CPL61 and CPL62 (step R3). Then, the wafer D1 is transferred as usual in the order of: resist coating module COT603→heating module HP626→buffer module SBU61 and processed.

Figure 12:
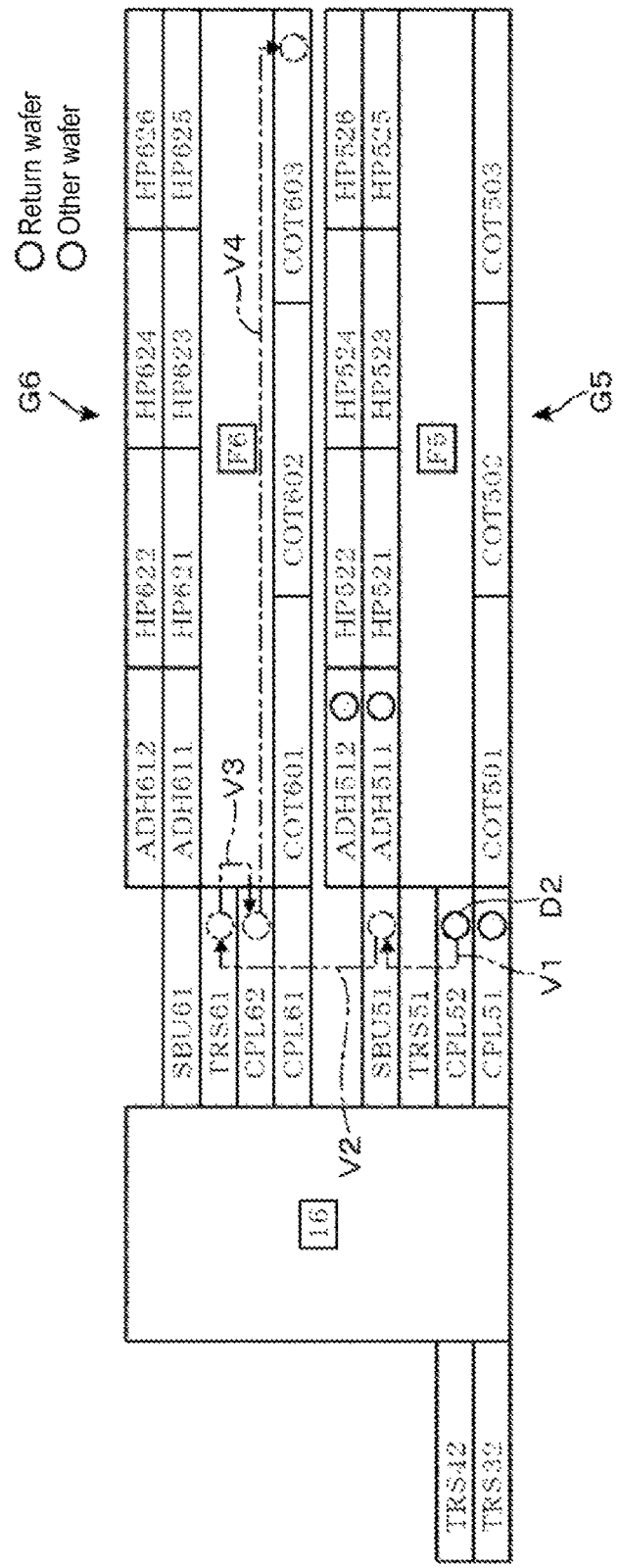
FIG. 12 is a schematic development view of unit blocks of the coating and developing apparatus.

Subsequently, a return transfer of the wafer (D2 in FIG. 12) loaded in the delivery module CPL52 will be described in detail with reference to FIG. 12. This corresponds to the case 1-2. Firstly, the wafer D2 is transferred to the buffer module SBU51 (step V1 in FIG. 12), and transferred from the buffer module SBU51 to the delivery module TRS61 of the unit block G6 (step V2 in FIG. 12) by the second delivery arm 16. Here, the transfer arm F6 delivers the wafer D2 to the delivery module CPL62 (step V3 in FIG. 12), even though the wafer D2 has already been temperature-adjusted in the delivery module CPL52. Thereafter, the wafer D2 is delivered to the resist coating module COT603 (step V4 in FIG. 12), and transferred in the order of: heating module HP626→buffer module SBU61 and processed, in the same manner as the normal transfer.

The reason for readjusting the temperature of the wafer D2 (which has been temperature-adjusted in the delivery module CPL of the fifth unit block G5) in the delivery module CPL of the sixth unit block will be described. If the wafer D2 is loaded into the resist coating module COT and the heating module HP, respectively, without being temperature-adjusted in the sixth unit block G6, the time taken from performing the temperature adjustment to loading into the resist coating module COT and the heating module HP respectively becomes different from those of other wafers W. Thereby, the temperature when the wafer D2 is loaded into the modules becomes different from that of other wafers W. As a result, there is a possibility that a processing status of the wafer D2 becomes different from that of other wafers. Therefore, it is possible to prevent a deviation in the processing by readjusting the temperature after the loading into the unit block G6. In addition, even when the resist coating module COT performs the preparing operation described above, the return wafer W is loaded into the delivery module CPL. Thus, there is no need for the transfer arm F6 to be on standby with holding the return wafer W. Therefore, the transfer arm F6 has an advantage of performing the transfer efficiently, since it can transfer another wafer W.

The example where the transfer to the resist coating modules COT501 to COT503 is disabled has been described. Now, a case where the transfer to the heating modules HP521 to HP526, instead of the resist coating modules COT501 to COT503, is disabled and the return transfer is performed on the wafer W of the resist coating module COT501 will be described. Since this case also corresponds to the case 1-2, the return wafer W is transferred in the order of: delivery module TRS61→delivery module CPL62 and temperature-adjusted. Thereafter, the return wafer W is transferred from the delivery module CPL62 to the heating modules HP626 and processed, since the processing subsequent to the resist coating module COT501 is performed by the heating module HP.

Subsequently, the order in which the return wafer W is transferred will be described case by case. Firstly, a case will be described in which the return wafers W in a unit block where the transfer is disabled consist of only one lot and a transfer arm of the unit block holds the wafer W of the lot (case 2-1). For the case 2-1, the return transfer is performed on the wafer W of the lot A held by the transfer arm in a preferential manner. Thereafter, the return transfer is performed according to the order in which the wafers W are discharged from the carrier Ca. The order in which the wafer W is discharged from the carrier Ca is the order of number allocated to each wafer W.

Further, a case will be described in which the return wafers W in an unit block where the transfer is disabled consist of a plurality of lots and the transfer arm of the unit block holds the wafer W of the subsequent lot (case 2-2). Before performing the return transfer, the transfer arm accesses the module where the preceding lot is loaded, and exchanges wafers W with the module to hold the preceding lot instead of the subsequent lot. The return transfer is performed on the preceding lot held by the transfer arm in a preferential manner. Thereafter, the return transfer is performed according to the order in which the wafers W are discharged from the carrier Ca in the same manner as the case 2-1. When the transfer arm of the unit block where the transfer is disabled does not hold the wafer W (case 2-3), the return transfer is performed according to the order in which the wafers W are discharged from the carrier Ca.

Figure 13:
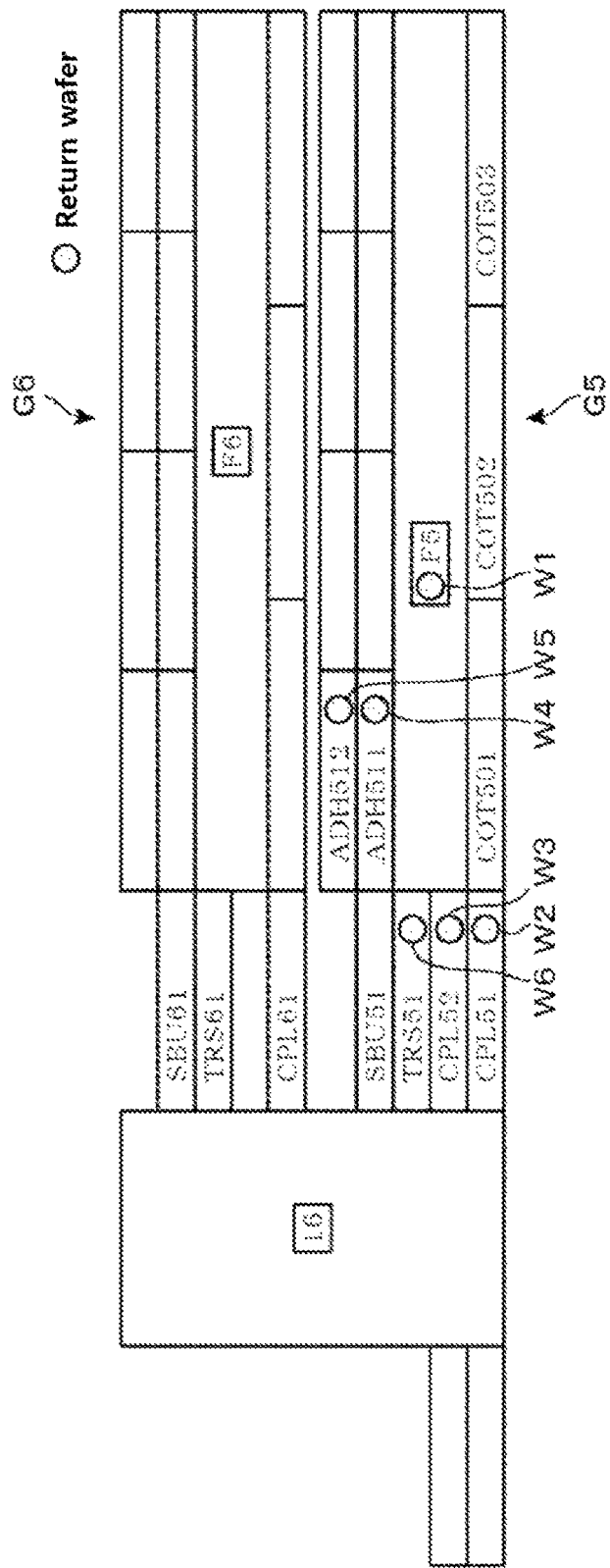
FIG. 13 is a schematic development view of unit blocks of the coating and developing apparatus.

A specific example will be described. For example, FIG. 13 shows a state in which the transfer to the resist coating modules COT501 to COT503 is disabled, as described above. The transfer arm F5 holds the wafer W not processed in the resist coating modules COT501 to COT503, and the return wafers W in the unit block G5 are from the same lot. In other words, this corresponds to the case 2-1. For the delivery module CPL and the hydrophobization treatment module ADH, the wafers W are loaded into them starting from the lower numbered module. Firstly, the wafer W held by the transfer arm F5 is transferred to the buffer module SBU51 and loaded into the unit block G6. Thereafter, each of the wafers W on the delivery modules CPL51 and CPL52, the hydrophobization treatment modules ADH511 and ADH512, and the delivery module TRS51 is transferred in this order to the buffer module SBU51 in this order, and loaded into the unit block G6. In FIG. 13, W1 to W6 are assigned to the wafers W in accordance with the order in which the return transfer is performed.

The return transfer is performed for the wafer W held by the transfer arm in a preferential manner. This is because the return wafer W cannot be unloaded from the module to the buffer module SBU51 if the transfer arm holds the wafer W. The lot held by the transfer arm is replaced in the case 2-2, and the return transfer is performed according to the order in which the wafers W are discharged from the carrier Ca in each case. This is because it is effective to process the wafers W of the same lot in succession in the unit block which is the destination of the return transfer as described above for reducing the number of times the preparing operation of the module is performed, and thus the wafers W of the same lot are transferred to the unit block in succession.

Figure 14:
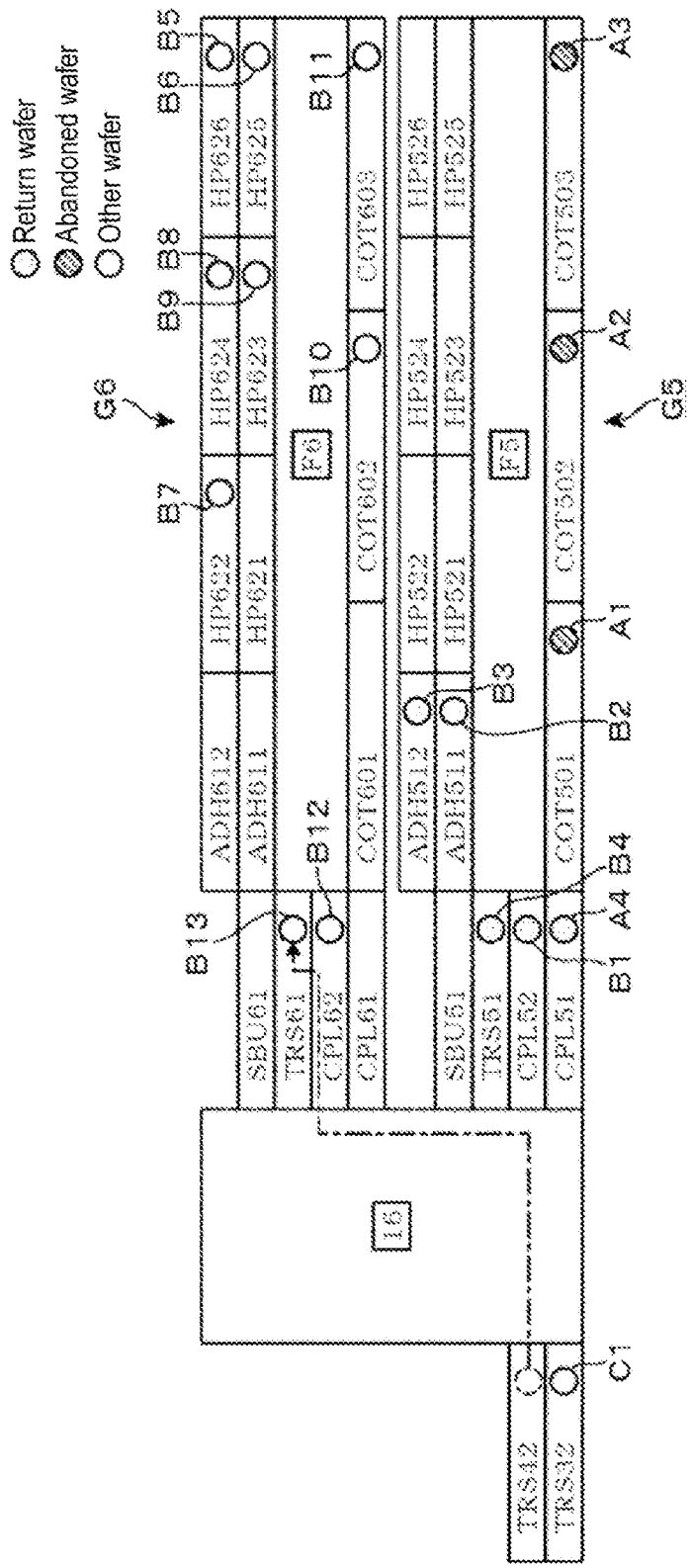
FIG. 14 is a schematic development view of unit blocks of the coating and developing apparatus.

The order of the return transfer and the transfer path to the destination of the return transfer will be described more specifically for an example in which the return wafers consist of a plurality of lots. FIG. 14 shows a situation where the transfer of the wafers W to the unit block G6 is continued after the transferred to the resist coating modules COT501 to COT503 is disabled, in the same manner as described above. The transfer arm F5 does not hold the wafer W. In other words, this corresponds to the case 2-3. In FIG. 14, the wafers W are shown numbered according to the order in which the wafers are discharged from the carrier earlier for each of lots A, B and C, and the wafers A4, B1 to B4 are return wafers. After the final wafer W (wafer B13) of the lot B is loaded into the delivery module TRS61, the return transfer starts before the wafer C1 at the beginning of the subsequent lot C is loaded into the unit block G6.

Figure 15:
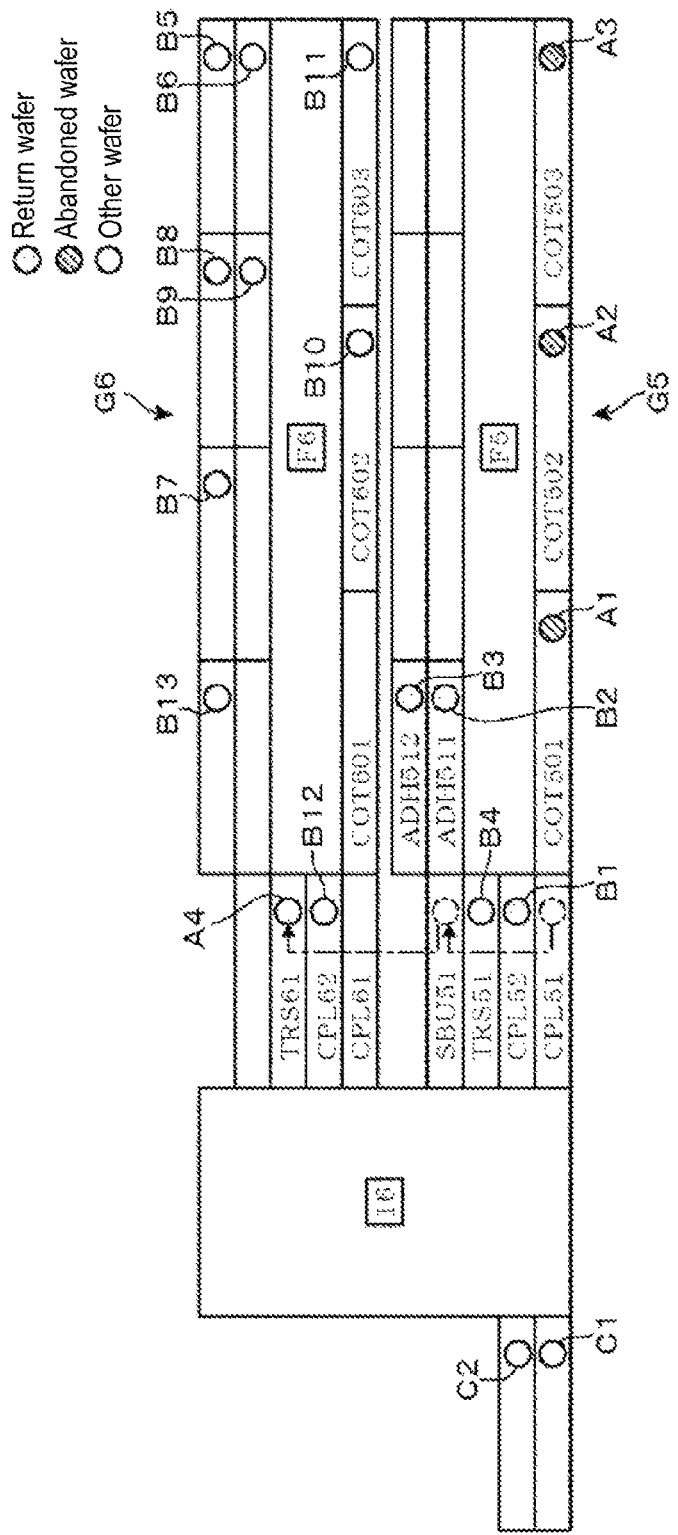
FIG. 15 is a schematic development view of unit blocks of the coating and developing apparatus.
Figure 16:
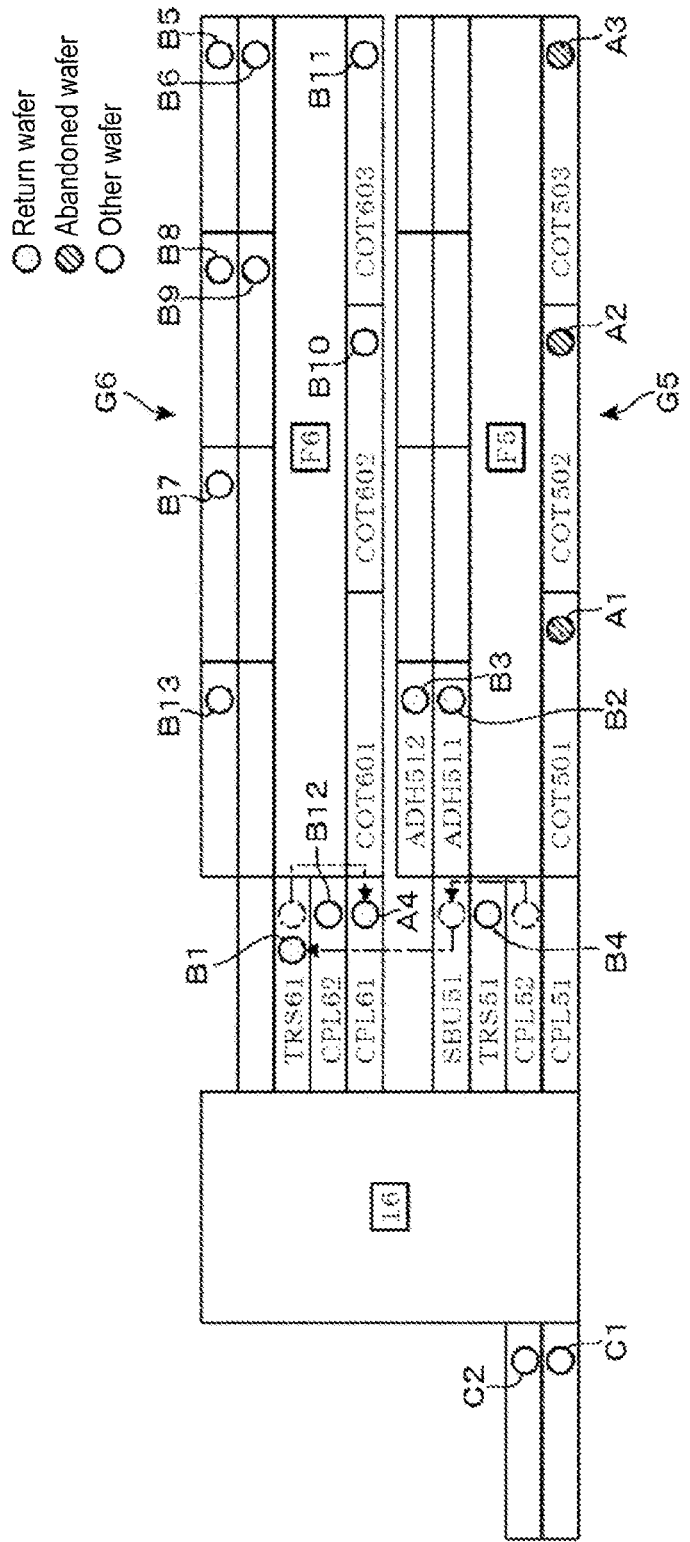
FIG. 16 is a schematic development view of unit blocks of the coating and developing apparatus.

The wafer A4 is discharged earliest of the return wafers. Therefore, the wafer A4 is transferred from the delivery module CPL51 via the buffer module SBU51 to the delivery module TRS61, as shown in FIG. 15. According the rule as described in the case 1-2, the wafer A4 is transferred to the delivery module CPL61. If the delivery module TRS61 is empty, the wafer B1 which is discharged next earliest of the return wafers remaining in the unit group G5 is transferred from the delivery module CPL52 via the buffer module SBU51 to the delivery module TRS61, as shown in FIG. 16.

Figure 17:
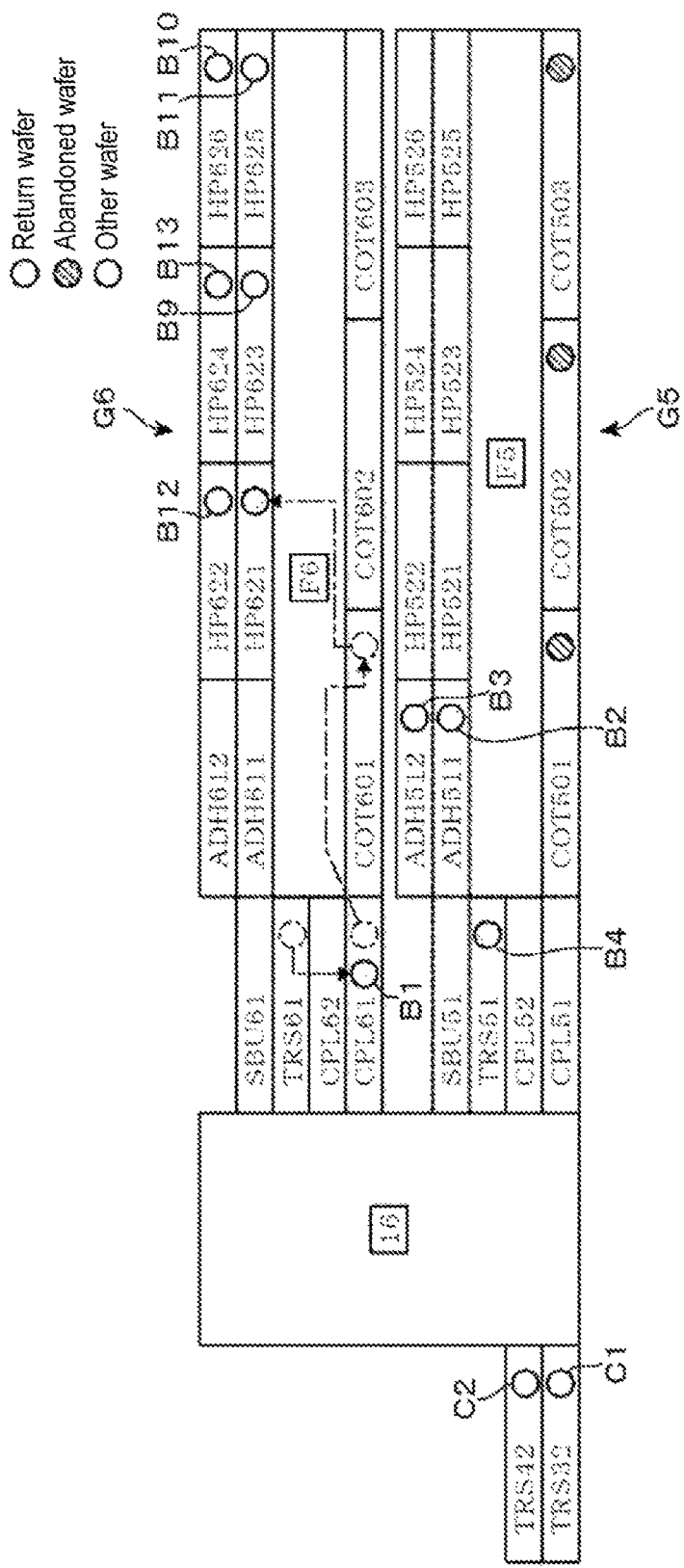
FIG. 17 is a schematic development view of unit blocks of the coating and developing apparatus.

The wafer A4 cooled in the delivery module CPL61 is loaded into the resist coating module COT601 and the heating module HP621 for which the preparing operation is performed so as to process the lot A, and processed. On the other hand, the wafer B1 is loaded into the delivery module CPL61 and subjected to temperature adjustment (FIG. 17). Then, the preparing operation is performed to process the lot B in the resist coating module COT601 and the heating module HP621 which processed and discharged the wafer A4. When the preparing operation ends, the wafer B1 is transferred to the resist coating module COT601 and the heating module HP621, and processed.

According to the rule as described above, the wafers B2, B3 and B4 are loaded in this order into the delivery module TRS61 which is empty after unloading the wafer B1. The wafers B2 and B3 on standby in the hydrophobization treatment modules ADH511 and ADH512, respectively, are transferred to the delivery module CPL61, and then transferred to the resist coating module COT601 and the heating module HP621 in the same manner as the wafer B1. The wafer B4 on standby in the delivery module TRS51 is transferred to the hydrophobization treatment module ADH611 and processed, and then transferred to the delivery module CPL61, the resist coating module COT601 and the heating module HP621 in this order.

Figure 18:
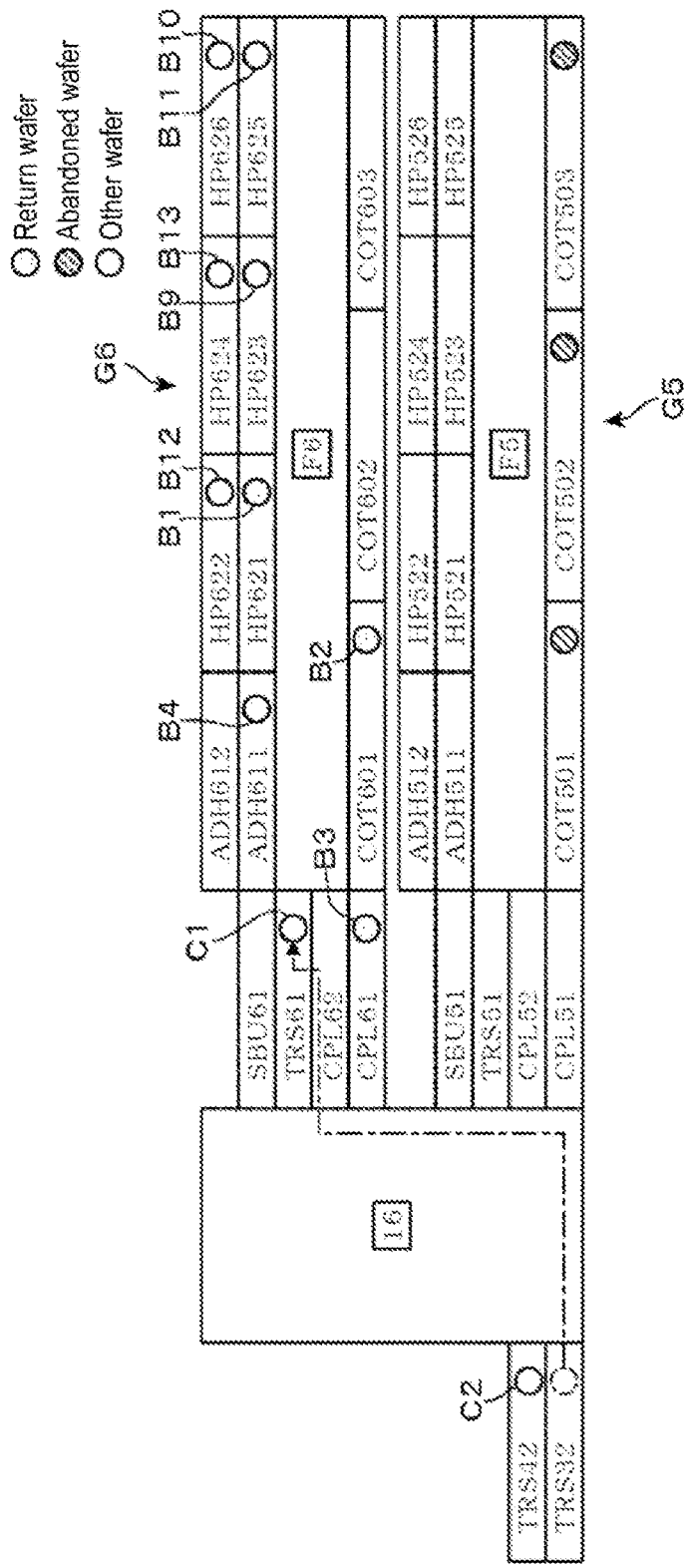
FIG. 18 is a schematic development view of unit blocks of the coating and developing apparatus.

When the last return wafer B4 is discharged from the delivery module TRS61, the loading of the wafer C1 into the delivery module TRS61 starts. Thereafter, the subsequent wafers W of the lot C are loaded into the delivery module TRS61 (FIG. 18). Upon finishing processing the normal wafers W of the lot B, the heating modules HP622 to HP626, the resist coating module COT602 and COT603 perform the preparing operation to process the lot C. For the resist coating module COT601 and the heating module HP621, the preparing operation is performed after the return wafer B4 is processed. However, a dummy dispense which is a preparing operation of the resist coating module COT is performed after the processing of the lot B in all of the resist coating modules COT601 to COT603 is finished, since the nozzle is shared by the resist coating modules COT601 to COT603. Then, wafers W of the lot C is loaded into each modules for which the preparing operation is performed, and processed.

Figure 19:
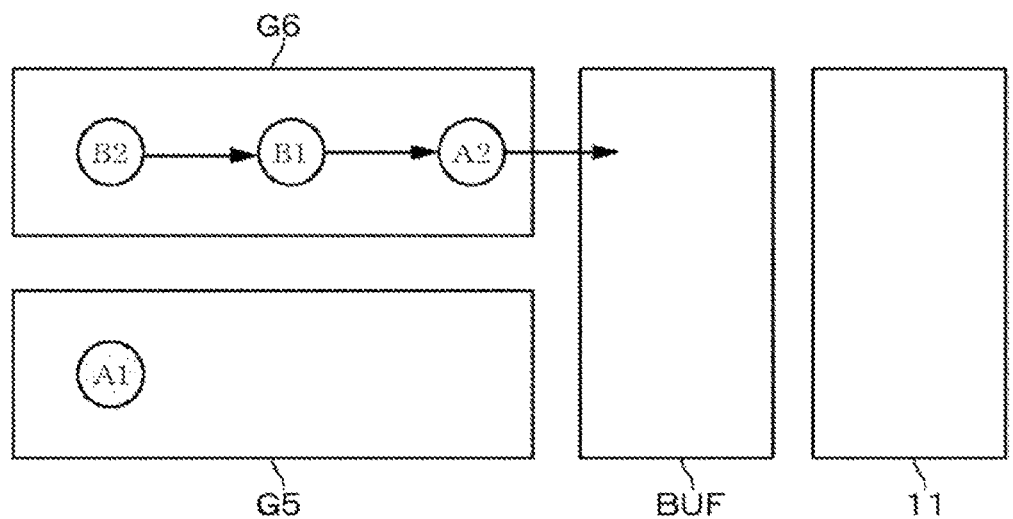
FIG. 19 is a schematic view showing a transfer path of the coating and developing apparatus.
Figure 20:
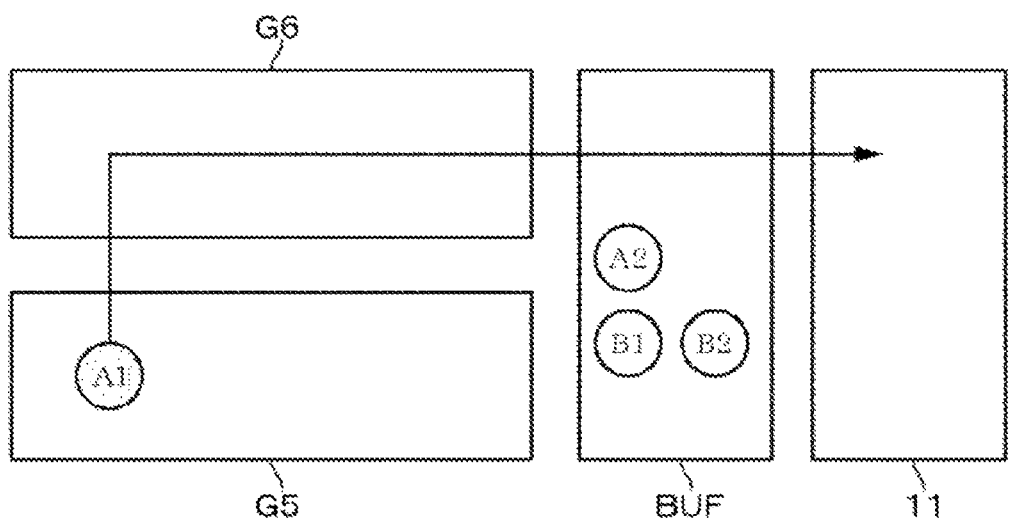
FIG. 20 is a schematic view showing the transfer path of the coating and developing apparatus.

In addition, the wafers W are loaded into the exposure device 11 in the order in which the wafer W is discharged from the carrier Ca to prevent the transfer control from becoming complicated. However, when the return transfer is performed, the wafer W discharged later is transferred to the module provided in the later stage, compared with the wafer W discharged earlier. A situation of the transfer to the exposure device 11 when the return transfer is performed in the unit blocks B5 and G6 will be descried with reference to schematic diagrams of FIGS. 19 and 20. In FIGS. 19 and 20, the preceding lot A and the subsequent lot B are shown in the same manner as described in the preceding drawings, and each lot is discharged from the carrier Ca in an ascending order of number. In addition, the return wafer is A1.

The wafer (A2 in the drawings) of the lot A and each wafer (B1 and B2 in the drawings) of the lot B which are discharged from the carrier later than the return wafer A1 are on standby in the buffer module BUF of the interface block S3 before they are loaded into the exposure device 11 (FIG. 19). Then the return wafer A1 is return-transferred to the buffer module BUF and discharged from the buffer module BUF to the exposure device 11. Thereafter, the wafers on standby are transferred to the exposure device 11 in the order in which the wafers are discharged from the carrier Ca (i.e., in order of wafers A2, B1 and B2), as shown in FIG. 19. In other words, due to the buffer module BUF, the order of discharging the wafers W to the exposure device 11 is adjusted to follow the order in which the wafers W are discharged from the carrier Ca. In addition, the return wafer is A1.

In this manner, the order of loading into the exposure device 11 is adjusted through the buffer module BUF. Therefore, the wafers W which overtake the return wafer and are transferred to the modules in the later stage are placed on the buffer module BUF and each of the modules before the buffer module BUF. Therefore, the number of wafers W which may be transferred while overtaking the return wafer W equals to the number of wafers W accommodated in the buffer module BUF added to the number of the modules before BUF −1 or less, where −1 corresponds to the transfer of the return wafer W. Therefore, the number of wafers accommodated in the buffer module BUF is appropriately adjusted to allow the return transfer.

The return transfer can be performed if a plurality of unit blocks where the same processing can be performed on substrates are provided. Thus, the return transfer can be performed at the unit blocks G3 and G4 and the unit blocks G1 and G2 for developing in the later stage of the exposure device 11. The wafers W of the unit blocks G1 and G2 have already been processed in the exposure device 11. Therefore, the wafers W may not be on standby in the buffer module BUF when the return transfer is performed at the unit blocks G1 and G2

Figure 21:
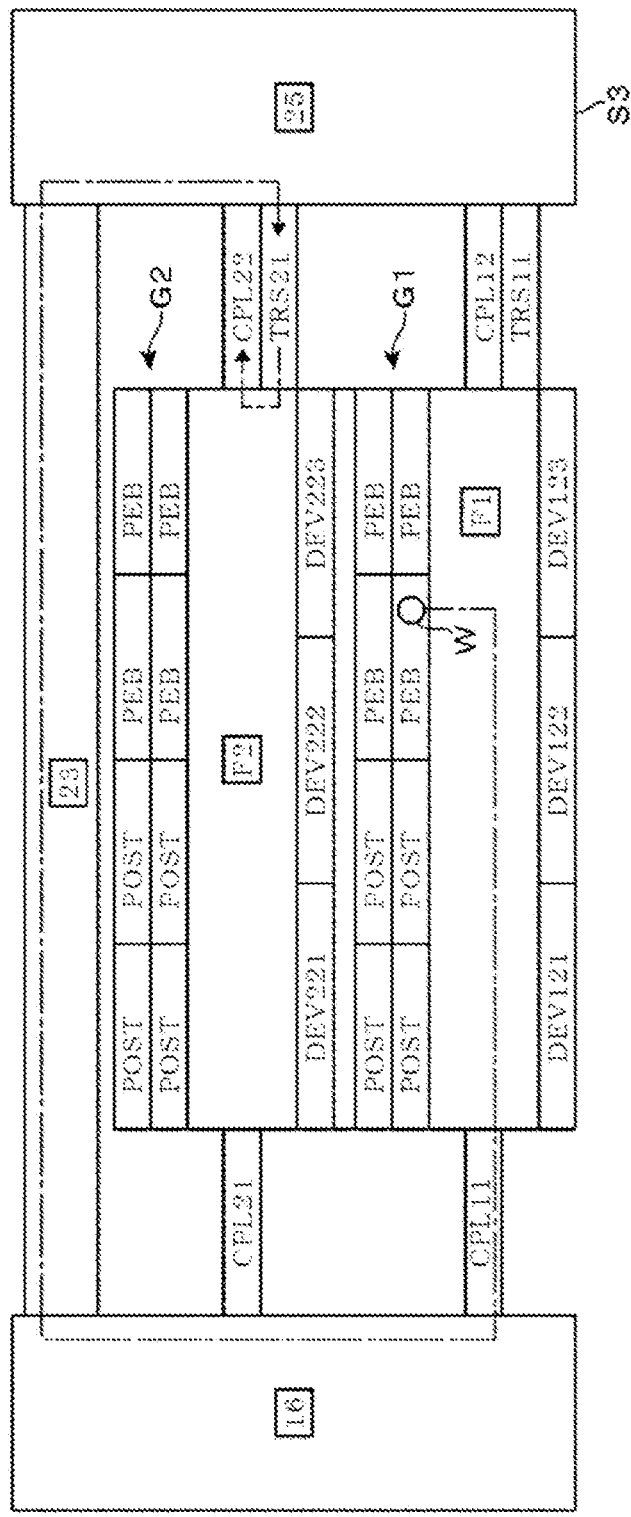
FIG. 21 is a schematic development view showing the unit block of the coating and developing apparatus.

Subsequently, an example of the return transfer being performed at the unit blocks G1 and G2 will be described with reference to FIG. 21. The developing module DEV is indicated as DEV121 to DEV123 in the unit block G1. The loading modules for the unit blocks G1 and G2 are delivery modules TRS11 and TRS21. The return transfer at the unit blocks G1 and G2 is performed so as not to transfer the wafers W from the interface block S3 to the unit blocks G1 and G2, thus preventing the transfer control of the interface arm 25 from being complicated. Here, a case where the transfer to the developing modules DEV121 to DEV123 of the unit block G1 is disabled and the wafer W of the heating module PEB on the previous stage is transferred as the return wafer W will be described.

If the last wafer W of the lot being loaded into the unit block G2 is loaded into the delivery module TRS21 when the transfer to all of the developing modules DEV121 to DEV123 is disabled, the return wafer W of the heating module PEB is transferred to the delivery module CPL11 by the transfer arm F1, and delivered to the shuttle 23 by the second delivery arm 16. The interface arm 25 receives the wafer W from the shuttle 23 and transfers the wafer W to the delivery module TRS21. Thereafter, the return wafer W is transferred to the delivery module CPL22 on the subsequent stage of the heating module PEB by the transfer arm F2, and transferred in the order of:

developing module DEV→heating module POST→delivery module CPL21→first delivery arm 13→carrier Ca, as normal.

The return wafer W may be transferred to the interface block S3 by the shuttle 23, and may be transferred from the shelf unit U1 to the shelf unit U6 by the transfer arm of another unit blocks G3 to G6. Specifically, for example, the delivery module TRS (TRS33) is provided at the level corresponding to the third unit block G3 in the shelf unit U6. When the return transfer is performed for the return wafer W of the unit block G1 as described above, the wafer W is transferred from the delivery module CPL11 which is the unloading module of the unit block G1 to the delivery module TRS31 which is the loading module of the third unit block G3 in a timely manner. Then, the wafer W is transferred to the delivery module TRS33 by the transfer arm F3, and transferred to the delivery module TRS21 by the interface arm 25, and taken into the unit block G1.

Once the return wafer W is returned from the unit block G1 to the carrier Ca, it may be transferred through the unit block G3 and the interface block S3 to the unit block G2. Even when the shuttle 23 is disabled or is not provided in the apparatus, it is possible to perform the return transfer by using the substrate transfer mechanism of the block other than the unit block for which the return transfer is performed.

Besides, in order to perform each return transfer in this way, the unit block is configured to have the delivery module CPL in the upper stream side of the fluid treatment module or the heating module. The reason is that such a configuration prevents the wafers W from being processed ununiformly, or prevents the transfer arm from being on standby with holding the wafer W, as described above. In addition, it is necessary to be ready for transferring the wafer W to the unloading module for unloading the wafer W from the unit block where the transfer is disabled.

According to the coating and developing apparatus 1, even when the transfer to one of the duplicated unit blocks G is disabled, the wafer W loaded into the unit block G where the transfer is disabled can be transferred to the other unit block where the transfer is possible and processed. Accordingly, it is possible to reduce the number of wafers W (rework wafers) which are recovered from the unit block where the transfer is disabled and is subjected to the processing of coating and developing again, thus saving production cost and labor. In addition, it is possible to reduce the time for recovering the wafer W from the unit block where the transfer is disabled, thus improving production efficiency of the coating and developing apparatus 1. On performing such a return transfer, the return wafer W is loaded into the unit block where the transfer is possible, following the last wafer W of the lot being loaded into the unit block where the transfer is possible. Thus, it is possible to reduce the number of the preparing operation of the module is performed and reduce a decrease in throughput.

The above examples have described the case where the multi-module for performing the same processing at one unit block is all stopped, but the module may not be configured as a multi-module. When a transfer to a module that is provided exclusively in the unit block G is disabled and the transfer in the unit block G is disabled, the return transfer can be performed similarly. In addition, since the number of wafers W to be the return wafers W is relatively small, the number of the processing module of the multi-module for processing the return wafer is set to one in the above examples. However, the number of the processing module may be set to more than one. In addition, upon performing the return transfer at the unit blocks G5 and G6, the return wafer W is once transferred to the buffer module SBU51 which is the unloading module of the unit block G5, and then to the delivery module TRS61 which is the loading module of the unit block G6 in the above examples. However, the return wafer W on standby in the module which the second delivery arm 16 cans access may be transferred to TRS61 directly.

The present disclosure is not limited to the substrate processing apparatus for processing wafers W, but is also applicable to a processing apparatus for processing LCD substrates or the like. In addition, the present disclosure is not limited to the substrate processing apparatus for performing the process of coating and developing on the wafer W, but is also applicable to, for example, a coating device for performing a process of coating and a developing device for performing a process of developing. In any of these cases where the substrate processing apparatus is configured as a coating and developing apparatus, a coating device or a developing device, the return transfer can be performed without providing the shuttle as described above. In addition, when the transfer to one of two unit blocks configured in the same manner is disabled, the transfer is performed in the other unit block in the above examples, but the present disclosure is not limited thereto. In other words, when three or more unit blocks are provided and the transfer to one of the unit blocks is disabled, the return wafers W may be distributed to two or more unit blocks for transferring. Further, the configuration of the unit block is not limited to the above configuration. For example, after the coating of the resist in the coating and developing apparatus 1, a plurality of unit blocks are provided to form a protection film on the upper layer of the resist film prior to exposure. In addition, the return transfer may be performed at the unit blocks.

According to the present disclosure, when a trouble occurs in the module of one unit block, the standby substrate placed on the module in the upper stream side than the troubled module is transferred to another unit block and processed, before the next lot of the lot to which the standby substrate belongs is loaded into another unit block or after the next lot is loaded into another unit block. Therefore, it is possible to reduce the number of substrates which are not processed and recovered, while preventing a decrease in throughput due to an increase in the number of adjustment operations of the module which is caused by the switching of lots.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
   a processing block including a plurality of unit blocks including a first unit block and a second unit block, each of the plurality of unit blocks configured to perform a same series of processing;
   a plurality of lots of substrates including a first lot and a second lot, each of the plurality of lots configured to be loaded into the processing block, the second lot to be loaded into the processing block after the first lot,
   wherein each of the plurality of unit blocks includes a group of modules configured to perform the same series of processing on substrates, and a first transfer mechanism configured to sequentially transfer the substrates from modules in an upper stream side of the group of modules to modules in a lower stream side of the group of modules, and the substrates loaded into the processing block are sequentially distributed to the group of modules in an uppermost stage of each of the plurality of unit blocks by a second transfer mechanism, and subjected to the same series of processing at each of the plurality of unit blocks where the substrates are distributed; and a control unit configured to control the substrate processing apparatus to perform:

stopping the loading of the substrates into the first unit block and operating the second transfer mechanism so as to load the substrates into the second unit block when a trouble is detected in a module of the first unit block, where a standby substrate is positioned in a module in the upper stream side of the troubled module of the first unit block;

controlling the first and second transfer mechanisms such that when a leading substrate of the second lot has been determined not to have been loaded into a module in the uppermost stage of the second unit block, the standby substrate is loaded into the module in the uppermost stage of the second unit block before loading the leading substrate, and when the leading substrate has been determined to have been loaded in the uppermost stage of the second unit block, the standby substrate is loaded into the module in the uppermost stage of the second unit block after a rearmost substrate of the second lot is loaded into the module in the uppermost stage of the second unit block;

controlling the first transfer mechanism of the second unit block so as to perform the same series of processing on the standby substrate loaded into the module in the uppermost stage of the second unit block; and when the trouble is detected, transferring the processed substrates from the second unit block into a standby module until the standby substrate is processed in the second unit block and transferred into the standby module, and adjusting an order of the processed substrates and the standby substrate in the buffer so that the standby substrate is transferred out from the buffer before the processed substrates.

2. The substrate processing apparatus of claim 1, wherein the group of modules further includes a temperature adjustment module configured to adjust a temperature of the substrate, and the standby substrate is loaded into a temperature adjustment module of the second unit block regardless of whether or not the standby substrate is temperature-adjusted in the temperature adjustment module of the first unit block.

3. The substrate processing apparatus of claim 1, wherein when there exist a plurality of standby substrates from the plurality of lots, the standby substrates are loaded into the second unit block starting from the standby substrate of the lot loaded into the first unit block earlier.

4. The substrate processing apparatus of claim 1, wherein a multi-module which performs a same transfer operation and the same series of processing as the group of modules is provided in the group of modules, and wherein at least one module of the multi-module in the second unit block is set for loading the standby substrate and the other modules are set for loading substrates which are delivered without passing through the first unit block.

5. The substrate processing apparatus of claim 1, wherein each unit block is connected to an exposure device, and the standby module in which a plurality of substrates are on standby is provided in the last stage of each unit block so as to transfer the substrates, on which resist is applied in upper stream side of the unit block or in the group of modules of the unit block, to the exposure device in a predetermined order.

6. The substrate processing apparatus of claim 1, wherein a carrier block into which a carrier storing substrates is loaded and an interface block configured to deliver the substrates to and from the exposure device are provided with each unit block interposed therebetween, each unit block including a developing module configured to develop the exposed substrate and deliver the developed substrate to the carrier block, and the second transfer mechanism includes a direct transfer mechanism configured to directly transfer the substrates on which a resist film is formed from the carrier block side to the interface block side.

7. A substrate processing method, comprising:

providing the apparatus of claim 1;

stopping the loading of the substrates into the first unit block and operating the second transfer mechanism so as to load the substrates into the second unit block when a trouble is detected in a module of the first unit block, where a standby substrate is positioned in a module in the upper stream side of the troubled module of the first unit block;

controlling the first and second transfer mechanisms such that when a leading substrate of the second lot has been determined not to have been loaded into a module in the uppermost stage of the second unit block, the standby substrate is loaded into the module in the uppermost stage of the second unit block before loading the leading substrate, and when the leading substrate has been determined to have been loaded in the uppermost stage of the second unit block, the standby substrate is loaded into the module in the uppermost stage of the second unit block after a rearmost substrate of the second lot is loaded into the module in the uppermost stage of the second unit block;

controlling the first transfer mechanism of the second unit block so as to perform the same series of processing on the standby substrate loaded into the module in the uppermost stage of the second unit block; and when the trouble is detected, transferring the processed substrates from the second unit block into a standby module until the standby substrate is processed in the second unit block and transferred into the standby module, and adjusting an order of the processed substrates and the standby substrate in the buffer so that the standby substrate is transferred out from the buffer before the processed substrates.

8. The substrate processing method of claim 7, wherein a temperature adjustment module configured to adjust a temperature of the substrate is included in the group of modules, and the standby substrate is loaded into a temperature adjustment module of the second unit block regardless of whether or not the standby substrate is temperature-adjusted in the temperature adjustment module of the first unit block.

9. The substrate processing method of claim 7, wherein when there exist a plurality of standby substrates from the plurality of lots, the standby substrates are loaded into the second unit block starting from the standby substrate of the lot loaded into the first unit block earlier.

10. The substrate processing method of claim 7, wherein a multi-module which performs a same transfer operation and the same series of processing as the group of modules is provided in the group of modules and, further comprising:

transferring the standby substrate to a module of the multi-module in the second unit block, the module being set for loading the standby substrate; and transferring the substrates delivered to the second unit block without passing through the first unit block to the modules other than the module set for loading the standby substrate.

11. The substrate processing method of claim 7, wherein each unit block is connected to an exposure device and the standby module in which a plurality of substrates are on standby is provided in the last stage of each unit block, and further comprising:

holding, in the standby module, the substrates on which resist is applied in the upper stream side of each unit block or in the group of modules of each unit block at the standby module; and transferring the standby substrate and the substrates on standby at the standby module to the exposure device in a predetermined order.

12. The substrate processing method of claim 7, wherein a carrier block into which a carrier storing substrates is loaded and an interface block configured to deliver substrates to and from the exposure device are provided with each unit block interposed therebetween, each unit block includes a developing module configured to develop the exposed substrate and delivers the developed substrate to the carrier block, the second transfer mechanism includes a direct transfer mechanism configured to directly transfer the substrates on which a resist film is formed from the carrier block side to the interface block side.

13. The substrate processing method of claim 12, further comprising:

performing the direct transfer.

14. A non-transitory computer-readable storage medium having thereon a computer program which performs, when used by a substrate processing apparatus, the substrate processing method of claim 7.

* * * * *